US012597387B2

(12) United States Patent
Guo

(10) Patent No.: US 12,597,387 B2
(45) Date of Patent: Apr. 7, 2026

(54) DISPLAY PANEL, DISPLAY DEVICE AND PIXEL REPAIR METHOD

(71) Applicants: Wuhan Tianma Microelectronics Co., Ltd., Wuhan (CN); Wuhan Tianma Microelectronics Co., Ltd. Shanghai Branch, Shanghai (CN)

(72) Inventor: Jiamin Guo, Wuhan (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 18/932,629

(22) Filed: Oct. 31, 2024

(65) Prior Publication Data

US 2025/0372035 A1 Dec. 4, 2025

(30) Foreign Application Priority Data

May 31, 2024 (CN) .......................... 202410704667.3

(51) Int. Cl.
 *G09G 3/3233* (2016.01)
 *G09G 3/3225* (2016.01)
 (Continued)

(52) U.S. Cl.
 CPC ......... *G09G 3/3233* (2013.01); *G09G 3/3225* (2013.01); *G09G 2300/0426* (2013.01);
 (Continued)

(58) Field of Classification Search
 CPC ............. G09G 2330/08; G09G 3/3233; G09G 2330/10; G09G 2300/0426; G09G 2300/0819; G09G 2300/0413; G09G 2330/12; G09G 3/006; G09G 3/32; G09G 3/3225; G09G 3/3208; G09G 2300/043;
 (Continued)

(56) References Cited

U.S. PATENT DOCUMENTS

2014/0292827 A1* 10/2014 Kang ................... G09G 3/3233
345/76
2015/0130787 A1* 5/2015 Chung ................. G09G 3/3225
345/76

(Continued)

*Primary Examiner* — Dismery Mercedes
(74) *Attorney, Agent, or Firm* — East IP P.C.

(57) ABSTRACT

Embodiments of the present application provides a display panel, a display device and a pixel repair method, the display panel comprises: pixel repair circuits; pixel circuits, each row of pixel circuits being provided with at least one pixel repair circuit; the pixel repair circuits are provided with first and second repair lines extending along a first direction, the first repair lines being connected with the anodes of the light-emitting device, the second repair lines being connected with the pixel repair circuits and the first repair lines, driving voltages output by the pixel repair circuits being transmitted to the anodes of the light-emitting device via the first and the second repair lines; a sum of a distance between a target light-emitting device corresponding to a target pixel circuit and a target connecting point and a distance between the target connecting point and a target pixel repair circuit meets a preset condition.

19 Claims, 10 Drawing Sheets

(51) Int. Cl.
   *H10K 59/131*       (2023.01)
   *H10K 59/12*        (2023.01)
   *H10K 71/00*        (2023.01)

(52) U.S. Cl.
   CPC .............. *G09G 2300/0819* (2013.01); *G09G 2300/0842* (2013.01); *G09G 2300/0861* (2013.01); *G09G 2320/0233* (2013.01); *G09G 2330/08* (2013.01); *G09G 2330/10* (2013.01); *H10K 59/1201* (2023.02); *H10K 59/131* (2023.02); *H10K 71/861* (2023.02)

(58) Field of Classification Search
   CPC ......... G09G 3/3266; G09G 2300/0842; G09G 2300/0861; H10K 59/131; H10K 71/861; H10K 59/88; H10K 59/1213
   See application file for complete search history.

(56)                References Cited

U.S. PATENT DOCUMENTS

| | | | |
|---|---|---|---|
| 2015/0138171 A1* | 5/2015 | Kim | G09G 3/3233 345/82 |
| 2015/0364531 A1* | 12/2015 | Kim | H10K 71/00 438/4 |
| 2015/0379908 A1* | 12/2015 | Kim | G09G 3/006 345/84 |
| 2016/0233286 A1* | 8/2016 | Kim | H10K 59/88 |
| 2016/0379535 A1* | 12/2016 | Park | G09G 3/006 345/211 |
| 2017/0316737 A1* | 11/2017 | Park | G09G 3/3208 |
| 2022/0320216 A1* | 10/2022 | Kim | H10K 59/1213 |
| 2023/0169921 A1* | 6/2023 | Kim | G09G 3/3233 345/204 |
| 2023/0267876 A1* | 8/2023 | In | G09G 3/006 345/55 |
| 2025/0218320 A1* | 7/2025 | Chi | H10K 59/131 |

* cited by examiner 65
64
63
62

Z
→X

61

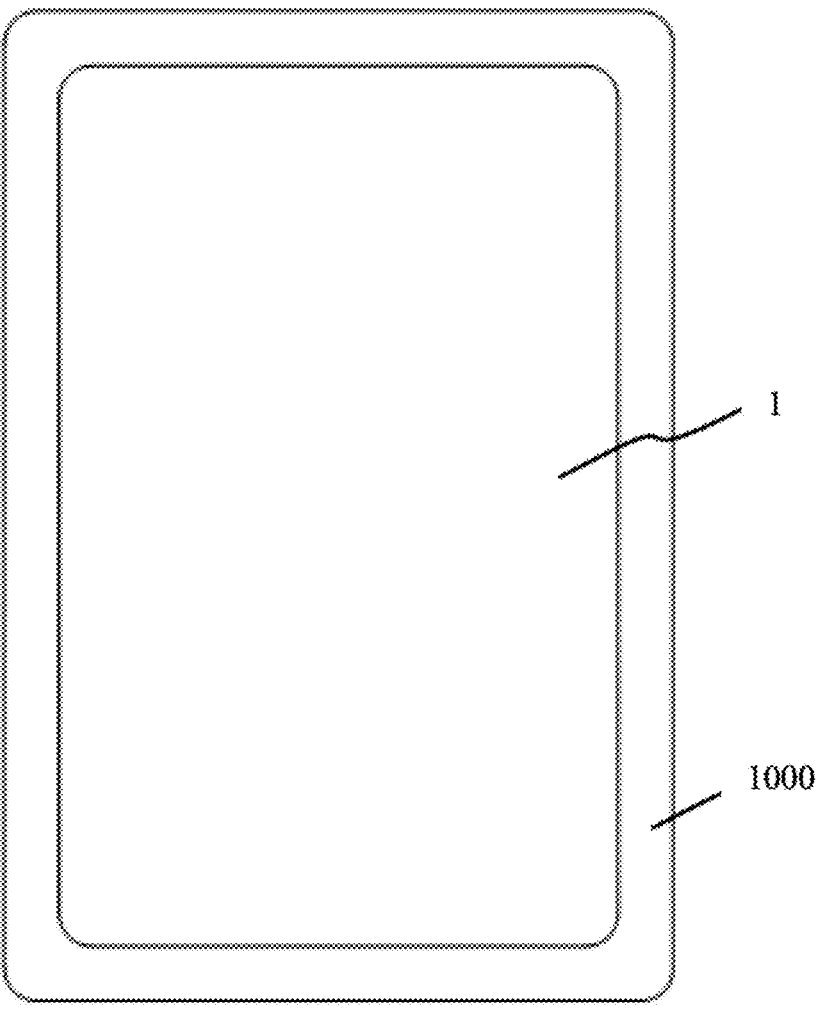

Fig. 13

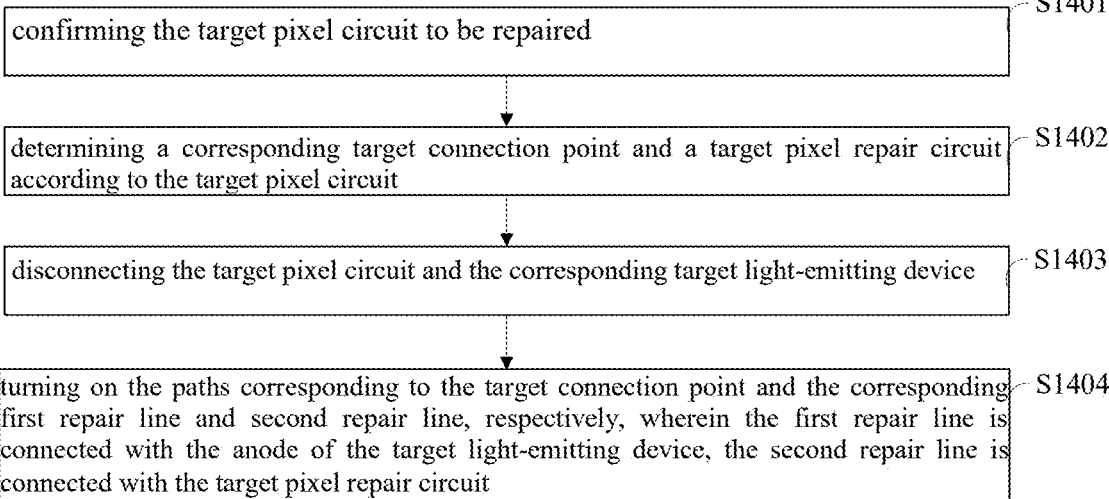

| confirming the target pixel circuit to be repaired | S1401 |

↓

| determining a corresponding target connection point and a target pixel repair circuit according to the target pixel circuit | S1402 |

↓

| disconnecting the target pixel circuit and the corresponding target light-emitting device | S1403 |

↓

| turning on the paths corresponding to the target connection point and the corresponding first repair line and second repair line, respectively, wherein the first repair line is connected with the anode of the target light-emitting device, the second repair line is connected with the target pixel repair circuit | S1404 |

Fig. 14

DISPLAY PANEL, DISPLAY DEVICE AND PIXEL REPAIR METHOD

CROSS-REFERENCE TO RELATED APPLICATION

The present application claims priority to Chinese Patent Application No. 202410704667.3 filed on May 31, 2024, and titled "DISPLAY PANEL, DISPLAY DEVICE AND PIXEL REPAIR METHOD", which is incorporated herein by reference in its entirety.

TECHNICAL FIELD

The present application relates to the technical field of display technology, and in particular to a display panel, a display device and a pixel repair method.

BACKGROUND

With the development of display technology, organic light-emitting diodes (OLED) are increasingly favored in display panel manufacturing. However, during the production and use of OLED display panels, defects may occur in the pixel circuits of the display panels. In this case, the defective pixels may not be controlled by the scanning signal or data signal and emit light normally, or the defective pixels may always appear black. This causes the display frame to be abnormal.

SUMMARY

One aspect of the present disclosure provides a display panel. The display panel includes: pixel repair circuits; pixel circuits connected with anodes of light-emitting devices, each row of pixel circuits being provided with at least one of the pixel repair circuit. The pixel repair circuits are provided with first repair lines and second repair lines extending along a first direction respectively, the first repair lines being connected with the anodes of the light-emitting devices, the second repair lines being connected with the pixel repair circuits and the first repair lines respectively, driving voltages output by the pixel repair circuits being transmitted to the anodes of the light-emitting devices via the first repair lines and the second repair lines.

A sum of a distance between a target light-emitting device corresponding to a target pixel circuit and a target connecting point and a distance between the target connecting point and a target pixel repair circuit meets a preset condition, the target connecting point being one of the connecting points between the first repair lines and the second repair lines, and the target pixel circuit being any one of the pixel circuits repair of which is supported by the target pixel repair circuit.

Another aspect of the present disclosure includes a display device. The display device includes a display panel. The display panel includes: pixel repair circuits; pixel circuits connected with anodes of light-emitting devices, each row of pixel circuits being provided with at least one of the pixel repair circuit. The pixel repair circuits are provided with first repair lines and second repair lines extending along a first direction respectively, the first repair lines being connected with the anodes of the light-emitting devices, the second repair lines being connected with the pixel repair circuits and the first repair lines respectively, driving voltages output by the pixel repair circuits being transmitted to the anodes of the light-emitting devices via the first repair lines and the second repair lines.

A sum of a distance between a target light-emitting device corresponding to a target pixel circuit and a target connecting point and a distance between the target connecting point and a target pixel repair circuit meets a preset condition, the target connecting point being one of the connecting points between the first repair lines and the second repair lines, and the target pixel circuit being any one of the pixel circuits repair of which is supported by the target pixel repair circuit.

Another aspect of the present disclosure includes a pixel repair method, applied to a display panel. The display panel includes: pixel repair circuits; pixel circuits connected with anodes of light-emitting devices, each row of pixel circuits being provided with at least one of the pixel repair circuit. The pixel repair circuits are provided with first repair lines and second repair lines extending along a first direction respectively, the first repair lines being connected with the anodes of the light-emitting devices, the second repair lines being connected with the pixel repair circuits and the first repair lines respectively, driving voltages output by the pixel repair circuits being transmitted to the anodes of the light-emitting devices via the first repair lines and the second repair lines.

A sum of a distance between a target light-emitting device corresponding to a target pixel circuit and a target connecting point and a distance between the target connecting point and a target pixel repair circuit meets a preset condition, the target connecting point being one of the connecting points between the first repair lines and the second repair lines, and the target pixel circuit being any one of the pixel circuits repair of which is supported by the target pixel repair circuit.

The pixel repair method comprises:

determining a target pixel circuit to be repaired;

determining a corresponding target connecting point and a corresponding target pixel repair circuit according to the target pixel circuit;

disconnecting the target pixel circuit from a corresponding target light-emitting device;

connecting the target connecting point with a corresponding first repair line and a corresponding second repair line respectively.

The first repair line is connected with the anode of the target light-emitting device, and the second repair line is connected with the target pixel repair circuit.

BRIEF DESCRIPTION OF THE DRAWINGS

In order to more clearly illustrate the technical solutions in the embodiments of the present application or the conventional technology, the drawings required for use in the embodiments or the conventional technology descriptions are briefly introduced below. Obviously, the drawings described below are only some embodiments of the present application. For the skilled in the art, other drawings can be obtained based on these drawings without creative work.

FIG. 13 illustrates a schematic structural diagram of a display device consistent with the disclosed embodiments of the present disclosure; and FIG. 14 illustrates a flow chart of a pixel repair method consistent with the disclosed embodiments of the present disclosure.

DETAILED DESCRIPTION

Figure 1:
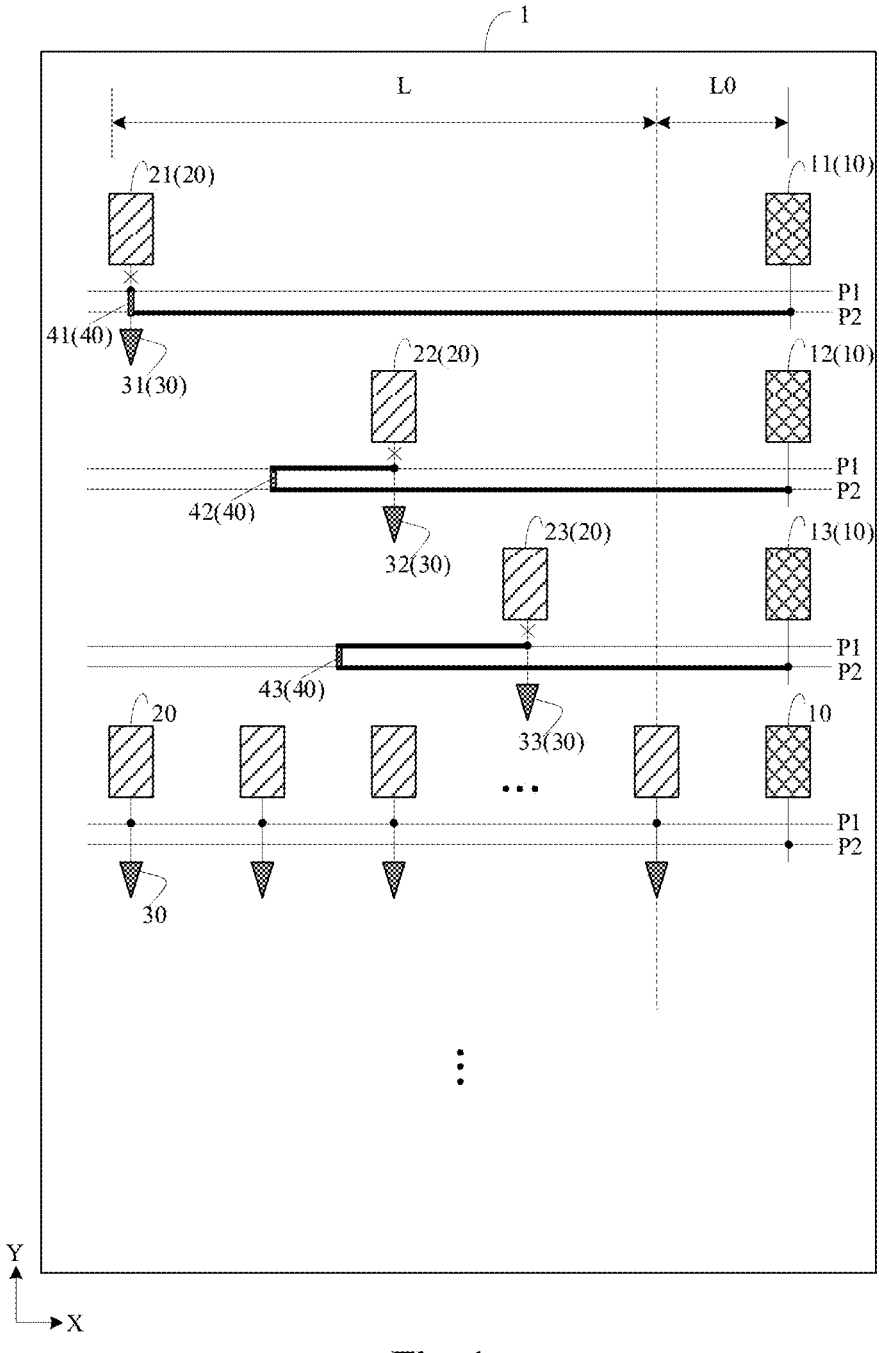
FIG. 1 illustrates a schematic top view of a display panel consistent with the disclosed embodiments of the present disclosure.

In order to facilitate the understanding of the present application, the present application will be described more fully below with reference to the relevant drawings. The preferred embodiments of the present application are provided in the drawings. However, the present application can be implemented in many different ways and is not limited to the embodiments described herein. On the contrary, the purpose of providing these embodiments is to make the understanding of the disclosure of the present application more thorough and comprehensive.

Unless otherwise defined, all technical and scientific terms used herein have the same meaning as those commonly understood by the skilled in the art to which this application belongs. The terms used herein in the specification of this application are only for the purpose of describing specific embodiments and are not intended to limit this application. The term "and/or" used herein comprises any and all combinations of one or more of the related listed items.

When describing positional relationships, unless otherwise specified, when an element such as a layer, film, or base plate is referred to as being "on" another element, it can be directly on the other element or there may be intervening elements. Further, when a layer is referred to as being "under" another layer, it can be directly under or there may be one or more intervening elements. It is also understood that when a layer is referred to as being "between" two layers, it can be the only layer between the two layers or there may be one or more intervening elements.

In the case of using "comprising", "having", and "comprise" described herein, another component may be added unless a clear limiting term such as "only", "consisting of", etc. is used. Unless mentioned otherwise, a term in the singular form may comprise a plural form and should not be understood as being one in number.

It should be understood that although the terms "first", "second", etc. may be used herein to describe various elements, these elements should not be limited by these terms. These terms are only used to distinguish one element from another element. For example, a first element may be referred to as a second element, and similarly, a second element may be referred to as a first element without departing from the scope of the present application.

It should also be understood that when interpreting an element, even if not explicitly described, the element is interpreted as comprising a range of error, which should be determined by those skilled in the art to be within an acceptable deviation range for a particular value. For example, "about," "approximately," or "substantially" may mean within one or more standard deviations, without limitation.

Furthermore, in the specification, the phrase "planar distribution schematic diagram" refers to a drawing when a target portion is viewed from above, and the phrase "cross-sectional schematic diagram" refers to a drawing when a section taken by vertically cutting the target portion is viewed from the side.

In addition, the drawings are not drawn to a 1:1 scale, and the relative sizes of the elements in the drawings are drawn only as examples and not necessarily according to the true scale.

When a pixel circuit in a display panel fails or is abnormal, generally a pixel repair circuit can be used to replace the abnormal pixel circuit, and the light-emitting device corresponding to the abnormal pixel circuit is driven by the pixel repair circuit to ensure the display effect of the display screen. In this case, the pixel repair circuit is electrically connected with the light-emitting device corresponding to the abnormal pixel circuit. However, the abnormal pixel circuit can be a pixel circuit at any position in the display panel, and thus the position of the abnormal pixel circuit is not fixed, which results in different repair line loading (RC Loading) between the pixel repair circuit and the light-emitting devices corresponding to the pixel circuits at different positions. Therefore, the display screen repaired by the pixel repair circuit may have uneven brightness at the repair points, affecting the display effect.

In response to the above technical problems, the inventors have found that by configuring two repair lines for the pixel repair circuit and designing the repair line between the pixel repair circuit and the light-emitting device corresponding to each pixel circuit, the length of the repair line between the pixel repair circuit and the light-emitting device corresponding to the pixel circuit at different positions are equal, which solves the problem of uneven repair line length caused by the non-fixed position of the abnormal pixel circuit, improves the phenomenon of uneven display brightness caused by uneven repair line length, and improves the display effect. Based on this, the inventors further studied the technical solution of the embodiment of the present application. Specifically, the display panel provided in the embodiment of the present application comprises pixel repair circuits and pixel circuits. In which, the pixel circuits are connected with anodes of the light-emitting devices, each row of pixel circuits is provided with at least one pixel repair circuit, the pixel repair circuits are configured with first repair lines and second repair lines extending along a first direction respectively, the first repair lines are connected with the anodes of the light-emitting devices, the second repair lines are connected with the pixel repair circuits and the first repair lines respectively, a driving voltage output by the pixel repair circuits is transmitted to the anodes of the light-emitting devices via the first repair lines and the second repair lines, wherein a sum of a distance between a target light-emitting device corresponding to a target pixel circuit and a target connecting point and a distance between the target connecting point and the target pixel repair circuit meets a preset condition.

By adopting the above technical solution, the first repair lines each are connected with the anodes of the light-emitting devices, the second repair lines each are connected with the pixel repair circuits, and the first repair lines and the second repair lines are connected via the connecting points corresponding to respective light-emitting devices, so that when a pixel circuit is abnormal, the pixel repair circuit replaces the abnormal pixel circuit to drive the light-emitting device to emit light, thereby ensuring the normal display of the display panel, and the repair line lengths between the pixel repair circuits and the light-emitting devices corresponding to the pixel circuits the repair of which is supported by the respective pixel repair circuits are equal. Therefore, the problem of uneven display that is prone to occur in the scenario where the pixel repair circuit repairs the pixel circuit can be improved, thereby improving the display effect.

The above is the core idea of this application. The technical solutions in the embodiments of this application will be described clearly and completely below in conjunction with the drawings in the embodiments of this application. Based on the embodiments in this application, all other embodiments obtained by the skilled in the art without creative work are within the scope of protection of this application.

Figure 2:
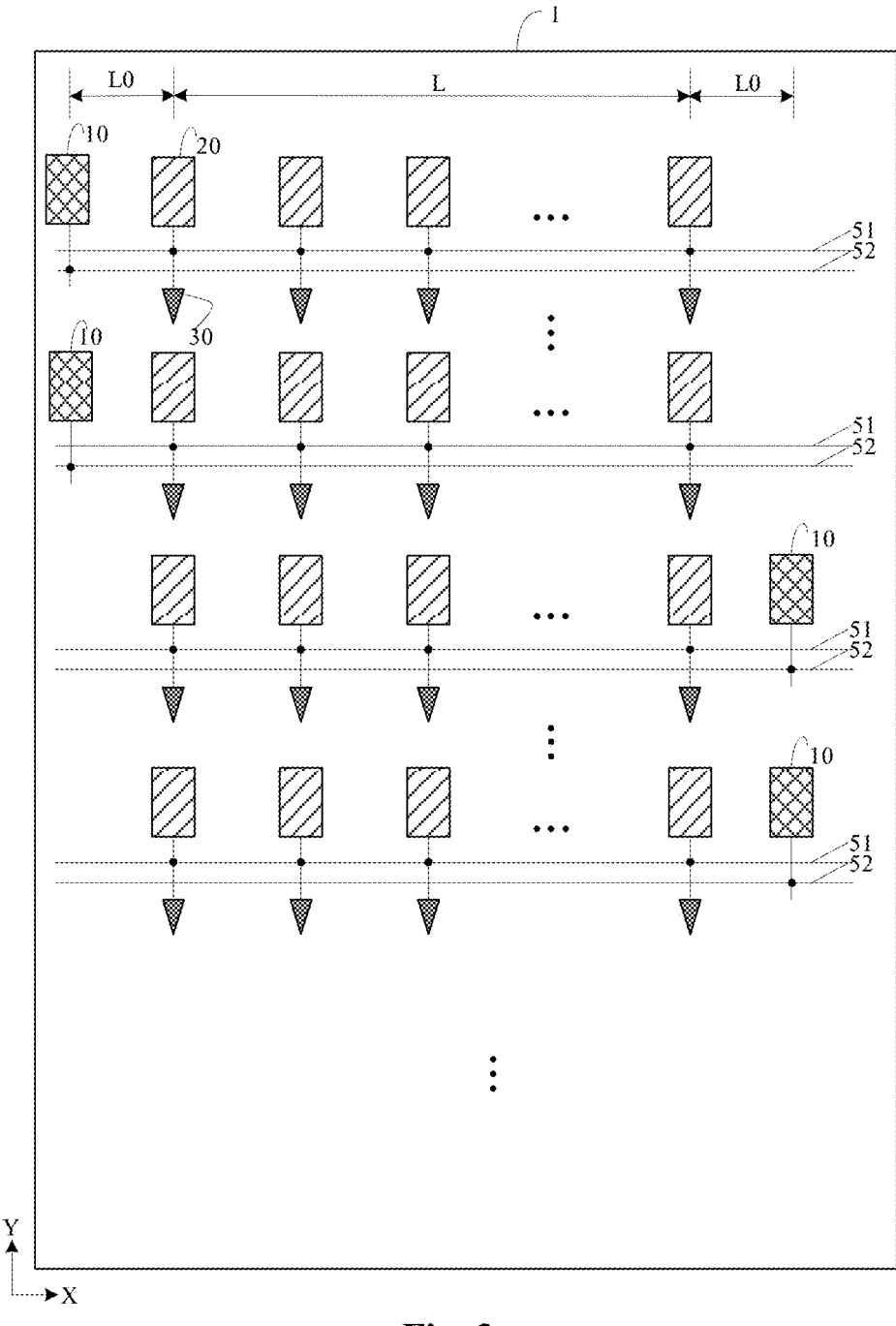
FIG. 2 illustrates a schematic top view of another display panel consistent with the disclosed embodiments of the present disclosure.
Figure 3:
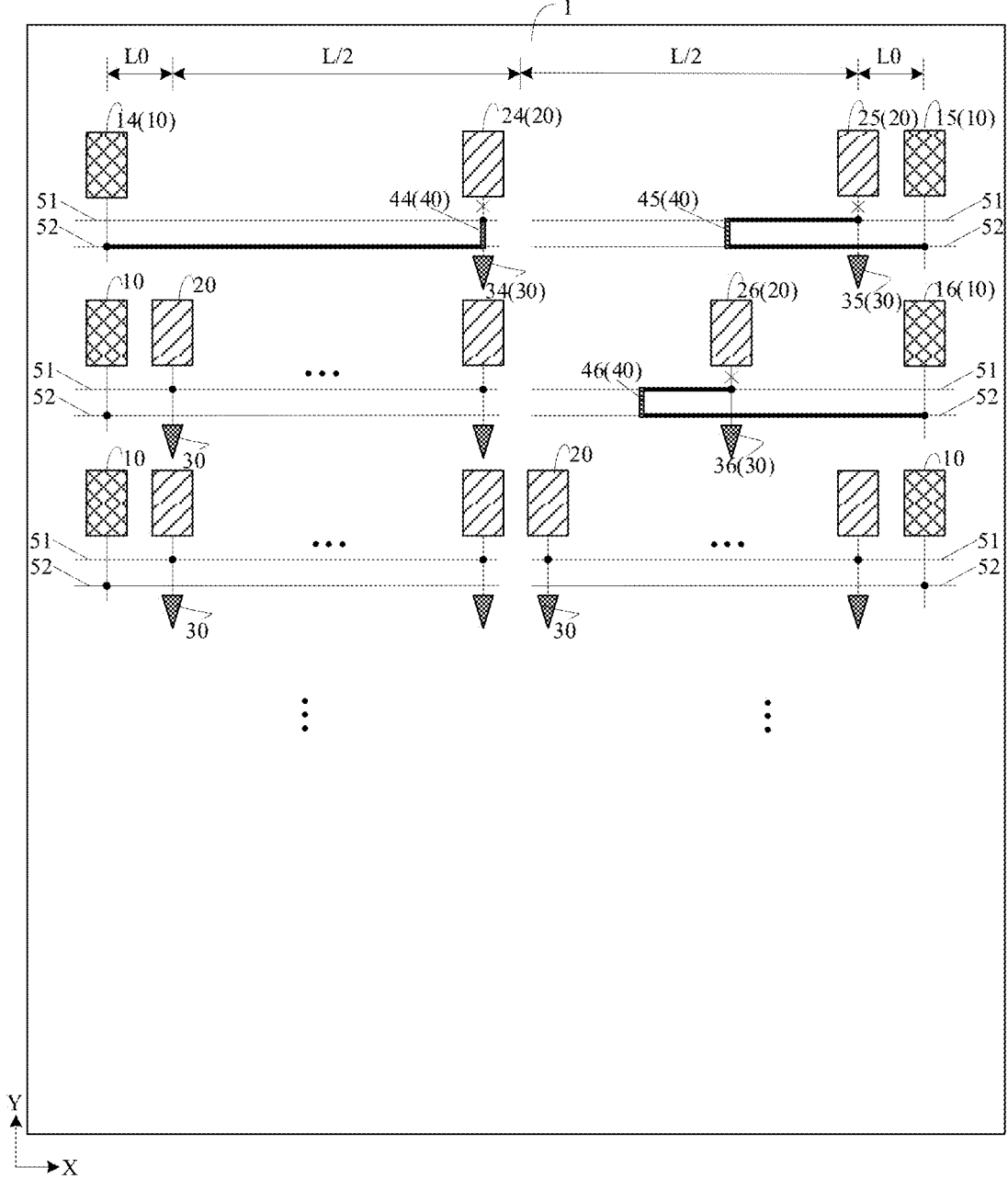
FIG. 3 illustrates a schematic top view of another display panel consistent with the disclosed embodiments of the present disclosure.

FIG. 1 is a top view schematic diagram of a display panel provided in an embodiment of the present application, FIG. 2 is a top view schematic diagram of another display panel provided in an embodiment of the present application, FIG. 3 is a top view schematic diagram of another display panel provided in an embodiment of the present application. As shown in FIG. 1 to FIG. 3, the display panel 1 provided in an embodiment of the present application comprises pixel repair circuits 10 and pixel circuits 20.

The pixel circuits 20 are connected with the anodes of the light-emitting devices 30, respectively. The pixel circuits 20 are used to drive the light-emitting devices 30 to emit light under normal circumstances. Each row of pixel circuits 20 is provided with at least one pixel repair circuit 10. For example, each row of pixel circuits 20 is provided with one pixel repair circuit 10, or each row of pixel circuits 20 is provided with two pixel repair circuits 10 correspondingly. As shown in FIGS. 1 to 3, the pixel circuits 20 in the display panel 1 may be arranged in an array; specifically, each row of pixel circuits 20 is distributed along the X-axis direction, and each column of pixel circuits 20 is distributed along the Y-axis. Embodiments of the present application do not limit the number or position of the pixel repair circuits 10, or pixel circuits 20 the repair of which is supported by the pixel repair circuits 10. For example, as shown in FIGS. 1 and 2, each row of pixel circuits 20 may be provided with one pixel repair circuit 10 correspondingly, which may be located on the left or right side of the corresponding row of the pixel circuit 20, and each pixel repair circuit 10 supports the repair of each pixel circuit 20 of the corresponding row. Here, in FIG. 1, each pixel repair circuit 10 is located on the right side of the corresponding row of pixel circuits 20, and in FIG. 2 some pixel repair circuits 10 are located on the left side of the corresponding rows of pixel circuits 20, the remaining pixel repair circuits 10 are located on the right side of the corresponding rows of pixel circuits 20. As shown in FIG. 3, each row of pixel circuits 20 may be provided with two pixel repair circuits 10 located on the left and right sides of the corresponding rows of pixel circuits 20, wherein the pixel repair circuit 10 on the left side supports the repair of each pixel circuit 20 in the left half area of the corresponding row, and the pixel repair circuit 10 on the right side supports the repair of each pixel circuit 20 in the right half area of the corresponding row. FIG. 1 to FIG. 3 are only for exemplary illustration, and in practical applications, the number and position of pixel repair circuits 10, and pixel circuits 20 the repair of which is supported by the pixel repair circuit 10 may be set according to requirements, and are not limited here.

The pixel repair circuits 10 each are provided with a first repair line 51 and a second repair line 52, that is, each pixel repair circuit 10 is provided with a group of repair lines. As shown in FIG. 1 and FIG. 2, each row of pixel circuits 20 is provided with one pixel repair circuit 10 and thus corresponds to one group of repair lines. As shown in FIG. 3, each row of pixel circuits 20 is provided with two pixel repair circuits 10 and thus corresponds to two groups of repair lines that are not connected with each other. The first repair lines 51 and the second repair lines 52 each extend along the first direction and are arranged in parallel and spaced along the second direction. In the embodiments shown in FIG. 1 to FIG. 3, the first direction is the row direction of the pixel circuits 20, that is, the X-axis direction, and the column direction of the pixel circuits 20 is the Y-axis direction. The material of the first repair lines 51 and the second repair lines 52 is a conductive material, comprising, but not limited to, a metal conductive material, such as copper, aluminum. The first repair lines 51 and the second repair lines 52 are intended to provide support for forming an electrical connection between the pixel repair circuits 10 and the light-emitting elements.

The first repair lines 51 are connected with the anodes of the light-emitting devices 30. The second repair lines 52 are connected with the pixel repair circuits 10 and the first repair lines 51, respectively. The driving voltage output by the pixel repair circuits 10 is used to be transmitted to the anodes of the light-emitting devices 30 via the first repair lines 51 and the second repair lines 52. That is, a pixel repair circuit 10 is used to drive the light-emitting device 30 corresponding to the abnormal pixel circuit 20 to emit light when a pixel circuit 20 is abnormal.

The sum of the distance between the target light-emitting device corresponding to the target pixel circuit and the target connecting point and the distance between the target connecting point and the target pixel repair circuit meets the preset condition. Here, the target pixel circuit is any one of the multiple pixel circuits 20 that the repair of which is supported by the target pixel. As shown in FIGS. 1 and 2, the pixel repair circuit 10 of each row supports the repair of each pixel circuit 20 of the corresponding row; as shown in FIG. 3, the pixel repair circuit 10 on the left side of each row supports the repair of each pixel circuit 20 corresponding to the left half of the row, and the pixel circuit 20 on the right side of each row supports the repair of each pixel circuit 20 corresponding to the right half of the row. The target connecting point is a connecting point 40 between the first repair line 51 and the second repair line 52. The target connecting point is used to connect the first repair line 51 and the second repair line 52 and is located between the first repair line 51 and the second repair line 52. The target connecting point corresponds to the target pixel circuit.

Different pixel circuits 20 correspond to different connecting points 40, and the connecting points 40 corresponding to pixel circuits 20 at different positions are at different positions. The preset condition is a preset fixed value, which can be set according to the specific structure of the display panel 1. The sum of the distances represents the length of the repair line between the target pixel repair circuit and the target light-emitting device, and the length of the repair line can be understood as the physical routing length. That is, for any abnormal pixel circuit 20 in the display panel 1, the sum of the distance between the light-emitting device 30 corresponding to the abnormal pixel circuit 20 and the connecting point 40 and the distance between the connecting point 40 and the pixel repair circuit 10 is a preset fixed value. In short, the lengths of the repair lines corresponding to the pixel circuits 20 each are equal.

In use, for multiple pixel circuits 20 in each row of pixel circuits 20, when an abnormality occurs in a pixel circuit 20, the path between the abnormal pixel circuit 20 and the anode of the corresponding light-emitting device 30 can be disconnected, and the anode of the light-emitting device 30 corresponding to the abnormal pixel circuit 20 can be electrically connected with the first repair line 51, and the first repair line 51 and the second repair line 52 are electrically connected at the connecting point 40 corresponding to the abnormal pixel circuit 20, and the second repair line 52 and the corresponding pixel repair circuit 10 are electrically connected, so that the pixel repair circuit 10 is electrically connected with the anode of the light-emitting device 30 corresponding to the abnormal pixel circuit 20 via the first repair line 51 and the second repair line 52, so that the abnormal pixel circuit 20 is replaced by the pixel repair circuit 10 to drive the light-emitting device 30 to emit light, thereby ensuring the normal display of the display panel 1.

In summary, the display panel 1 provided in embodiments of the present application sets the first repair lines 51 and the second repair lines 52 for the pixel repair circuits 10. When a pixel circuit 20 is abnormal, the first repair line 51 is connected with the anode of the light-emitting device 30 corresponding to the abnormal pixel circuit 20, the first repair line 51 and the second repair line 52 are connected at the connecting point 40 corresponding to the abnormal pixel circuit 20, and the pixel repair circuit 10 corresponding to the abnormal pixel circuit 20 is connected via the second repair line 52, thereby forming a repair path between the anode of the light-emitting device 30 corresponding to the abnormal pixel circuit 20 and the pixel repair circuit 10, so that the pixel repair circuit 10 replaces the abnormal pixel circuit 20 to drive the light-emitting device 30 to emit light, thereby ensuring the normal display of the display panel 1. Since the sum of the distance between the target light-emitting device corresponding to the target pixel circuit and the target connecting point and the distance between the target connecting point and the target pixel repair circuit meets the preset conditions, and the target pixel circuit is any one of the multiple pixel circuits 20 the repair of which is supported by the target pixel repair circuit, therefore, for the multiple pixel circuits 20 the repair of which is supported by the pixel repair circuits 10, the lengths of the repair lines between the pixel repair circuits 10 and the light-emitting devices 30 corresponding to the pixel circuits 20 at any position are equal, so the repair line loads (RC Loading) between the pixel repair circuit 10 and the light-emitting devices 30 corresponding to the abnormal pixel circuits 20 at different positions are equivalent, thereby solving the problem of uneven display caused by different repair line loads due to different positions of the abnormal pixel circuit

20, thereby improving the display effect. Here, the repair line load comprises at least one of the repair line equivalent resistance or the repair line equivalent capacitance.

Referring to FIGS. 1 to 3, in one embodiment, the distance between the target connecting point and the target pixel repair circuit is negatively correlated with the distance between the target pixel circuit and the target pixel repair circuit. In which, the target pixel circuit is any one of the multiple pixel circuits 20 that the target pixel repair circuit supports repair. The target pixel circuit drives the target light-emitting device to emit light under normal circumstances, and the target pixel repair circuit drives the target light-emitting device to emit light when the target pixel circuit is abnormal. The target connecting point refers to the point connecting the first repair line 51 and the second repair line 52 on the repair line corresponding to the target pixel circuit. The greater the distance between the target pixel circuit and the target pixel repair circuit, the smaller the distance between the target connecting point and the target pixel circuit; the smaller the distance between the target pixel circuit and the target pixel repair circuit, the greater the distance between the target connecting point and the target pixel circuit.

The distance between the target connecting point and the target pixel repair circuit is positively correlated with the width of each row of pixel circuits 20 along the first direction. The width of each row of pixel circuits 20 along the first direction refers to the distance between the pixel circuits 20 at two ends of each row of pixel circuits 20 along the first direction, or in other words, the width of each row of pixel circuits 20 along the first direction refers to the distance between the first column of pixel circuits 20 and the last column of pixel circuits 20 in the first direction. As shown in FIGS. 1 to 3, the width of each row of pixel circuits 20 along the first direction is L. The larger the width of each row of pixel circuits 20 along the first direction, the larger the distance between the target connecting point and the target pixel repair circuit; the smaller the width of each row of pixel circuits 20 along the first direction, the smaller the distance between the target connecting point and the target pixel repair circuit.

For multiple pixel circuits 20 the repair of which is supported by each pixel repair circuit 10, the positions of the pixel circuits 20 on the display panel 1 are different, and the distances between the pixel circuits 20 each and the pixel repair circuit 10 are different. Therefore, when the pixel repair circuits 10 each are used to repair the pixel circuit 20 at any position, on the basis of configuring the first repair lines 51 and the second repair lines 52, by adjusting the positions of the connecting points 40 between the first repair line 51s and the second repair lines 52, the repair line lengths between the pixel repair circuits 10 each and the anodes of the light-emitting devices 30 corresponding to the respective pixel circuits 20 are equal, and the repair line loads between the pixel repair circuits 10 and the respective light-emitting devices 30 are balanced, thereby solving the problem of unbalanced repair line loads caused by different positions of the pixel circuits 20, improving the phenomenon of uneven display caused by unbalanced repair line loads, and improving the display effect.

Still referring to FIGS. 1 and 2, in an embodiment, each row of pixel circuits 20 is provided with one pixel repair circuit 10 located on one side of each row of pixel circuits 20 in the first direction. As shown in FIGS. 1 and 2, the pixel repair circuits 10 each are located on the right side of each row of pixel circuits 20 in the X-axis direction, and each pixel repair circuit 10 supports the repair of any pixel circuit 20 in the same row. The distance between the target connecting point and the target pixel repair circuit is $(L-X)/2$, where L represents the width of each row of pixel circuits 20 in the first direction and is a fixed value. Generally, the width of each row of pixel circuits 20 in the first direction is the same. X represents the distance between the target pixel circuit and the target pixel repair circuit. For multiple pixel circuits 20 in the same row that the repair of which is supported by one pixel repair circuit 10, the distances X between the pixel circuits 20 each and the pixel repair circuit 10 are different, and accordingly, the connecting points 40 between the first repair lines 51 and the second repair lines 52 corresponding to the respective pixel circuits 20 are at different positions.

Taking the structure shown in FIG. 1 as an example, for example, the pixel circuit 21 is abnormal, the distance between the pixel circuit 21 and the pixel repair circuit 11 is $L+L0$, the distance between the light-emitting device 31 corresponding to the pixel circuit 21 and its connecting point 41 is 0, and the distance between the connecting point 41 and the pixel repair circuit 11 is $L+L0$, then the length of the repair line between the light-emitting device 31 and the pixel repair circuit 11 is $0+L+L0=L+L0$; for another example, the pixel circuit 22 is abnormal, the distance between the pixel circuit 22 and the pixel repair circuit 12 is $L/2+L0$, the distance between the light-emitting device 32 corresponding to the pixel circuit 22 and its connecting point 42 is $L/4$, and the distance between the connecting point 41 and the pixel repair circuit 11 is $L/4$, the distance between the contact 42 and the pixel repair circuit 12 is $3L/4+L0$, so the length of the repair line between the light-emitting device 32 and the pixel repair circuit 12 is $L/4+3L/4+L0=L+L0$; for another example, the pixel circuit 23 is abnormal, the distance between the pixel circuit 23 and the pixel repair circuit 13 is $L/4+L0$, the distance between the light-emitting device 33 corresponding to the pixel circuit 23 and its connecting point 43 is $3L/8$, and the distance between the connecting point 43 and the pixel repair circuit 13 is $5L/8+L0$, so the length of the repair line between the light-emitting device 33 and the pixel repair circuit 13 is $3L/8+5L/8+L0=L+L0$. It can be seen that the length of the repair line between the pixel repair circuit and each corresponding light-emitting device is $L+L0$.

In the display panel 1 provided by the above-mentioned embodiment, each pixel repair circuit 10 supports repair of multiple pixel circuits 20 in the same row. When a pixel circuit 20 at any position is abnormal, the pixel repair circuit 10 is connected with the light-emitting device 30 corresponding to the abnormal pixel circuit 20 via the first repair line 51, the second repair line 52 and the connecting point 40 corresponding to the abnormal pixel circuit 20, so that the repair line length between each pixel repair circuit 10 and any one of the light-emitting devices 30 corresponding to the pixel circuits 20 at different positions is $L+L0$. Therefore, the repair line loads between the pixel repair circuits 10 and the respective light-emitting devices 30 corresponding to the pixel circuits 20 at different positions are the same, which solves the problem of unbalanced repair line load caused by different positions of the pixel circuit 20, thereby improving the display effect.

Still referring to FIG. 3, in one embodiment, each row of pixel circuits 20 is provided with two pixel repair circuits 10 located on two sides of each row of pixel circuits 20 in the first direction respectively. As shown in FIG. 3, for each row of pixel circuits 20, the two pixel repair circuits 10 are located on the left and right sides of the same row of pixel circuits 20 in the X-axis direction respectively, wherein the pixel repair circuit 10 on the left side supports the repair of the pixel circuits 20 in the left half of row, and the pixel repair circuit 10 on the left side supports the repair of the pixel circuits 20 in the right half of the row. Here, the distance between the target connecting point and the target pixel repair circuit is $(L/2-X)/2$, where L represents the width of each row of pixel circuits 20 along the first direction, and L is a fixed value. Generally, the width of each row of pixel circuits 20 in the first direction is the same. X represents the distance between the target pixel circuit and the target pixel repair circuit. For each half row of multiple pixel circuits 20 supported by one pixel repair circuit 10, the distances X between the pixel circuits 20 each and the pixel repair circuit 10 are different. Accordingly, the positions of the connecting points 40 between the first repair line 51 and the second repair line 52 corresponding to the respective pixel circuits 20 are different.

Taking the structure shown in FIG. 3 as an example, for example, the pixel circuit 24 is abnormal, the distance between the pixel circuit 24 and the pixel repair circuit 14 is $L/2+L0$, the distance between the light-emitting device 34 corresponding to the pixel circuit 24 and its connecting point 44 is 0, and the distance between the connecting point 44 and the pixel repair circuit 14 is $L/2+L0$, then the length of the repair line between the light-emitting device 34 and the pixel repair circuit 14 is $0+L/2+L0=L/2+L0$; for another example, the pixel circuit 25 is abnormal, the distance between the pixel circuit 25 and the pixel repair circuit 15 is $L0$, and the distance between the light-emitting device 35 corresponding to the pixel circuit 25 and its connecting point 45 is $L/4$, the distance between the connecting point 42 and the pixel repair circuit 12 is $L/4+L0$, then the length of the repair line between the light-emitting device 32 and the pixel repair circuit 12 is $L/4+L/4+L0=L/2+L0$; for another example, the pixel circuit 26 is abnormal, the distance between the pixel circuit 26 and the pixel repair circuit 16 is $L/4+L0$, the distance between the light-emitting device 36 corresponding to the pixel circuit 26 and its connecting point 46 is $L/8$, and the distance between the connecting point 46 and the pixel repair circuit 16 is $3L/8+L0$, then the length of the repair line between the light-emitting device 36 and the pixel repair circuit 16 is $L/8+3L/8+L0=L/2+L0$. It can be seen that the length of the repair line between the pixel repair circuit and each corresponding light-emitting device is $L/2+L0$.

In the display panel 1 provided by the above-mentioned embodiment, each pixel repair circuit 10 supports the repair of multiple pixel circuits 20 in the same row. When a pixel circuit 20 at any position is abnormal, the pixel repair circuit 10 is connected with the light-emitting device 30 corresponding to the abnormal pixel circuit 20 via the first repair line 51, the second repair line 52 and the connecting point 40 corresponding to the abnormal pixel circuit 20, so that the repair line lengths between the pixel repair circuits 10 and the light-emitting devices 30 corresponding to the pixel circuits 20 at different positions each are $L/2+L0$. Therefore, the repair line loads between the pixel repair circuits 10 and the light-emitting devices 30 corresponding to the pixel circuits 20 at different positions are the same, which solves the problem of unbalanced repair line load caused by different positions of the pixel circuits 20, thereby improving the display effect.

Based on the embodiments shown in FIGS. 1 to 3 above, it can be known that the length of the repair line between the pixel repair circuit 10 and the multiple light-emitting devices 30 is a fixed value, and the fixed value of the repair line length can be set accordingly according to the specific structure of the display panel 1, and the position of the connecting point 40 between the first repair line 51 and the second repair line 52 is set accordingly according to the position of the pixel circuit 20.

Figures 4, 5, 6:
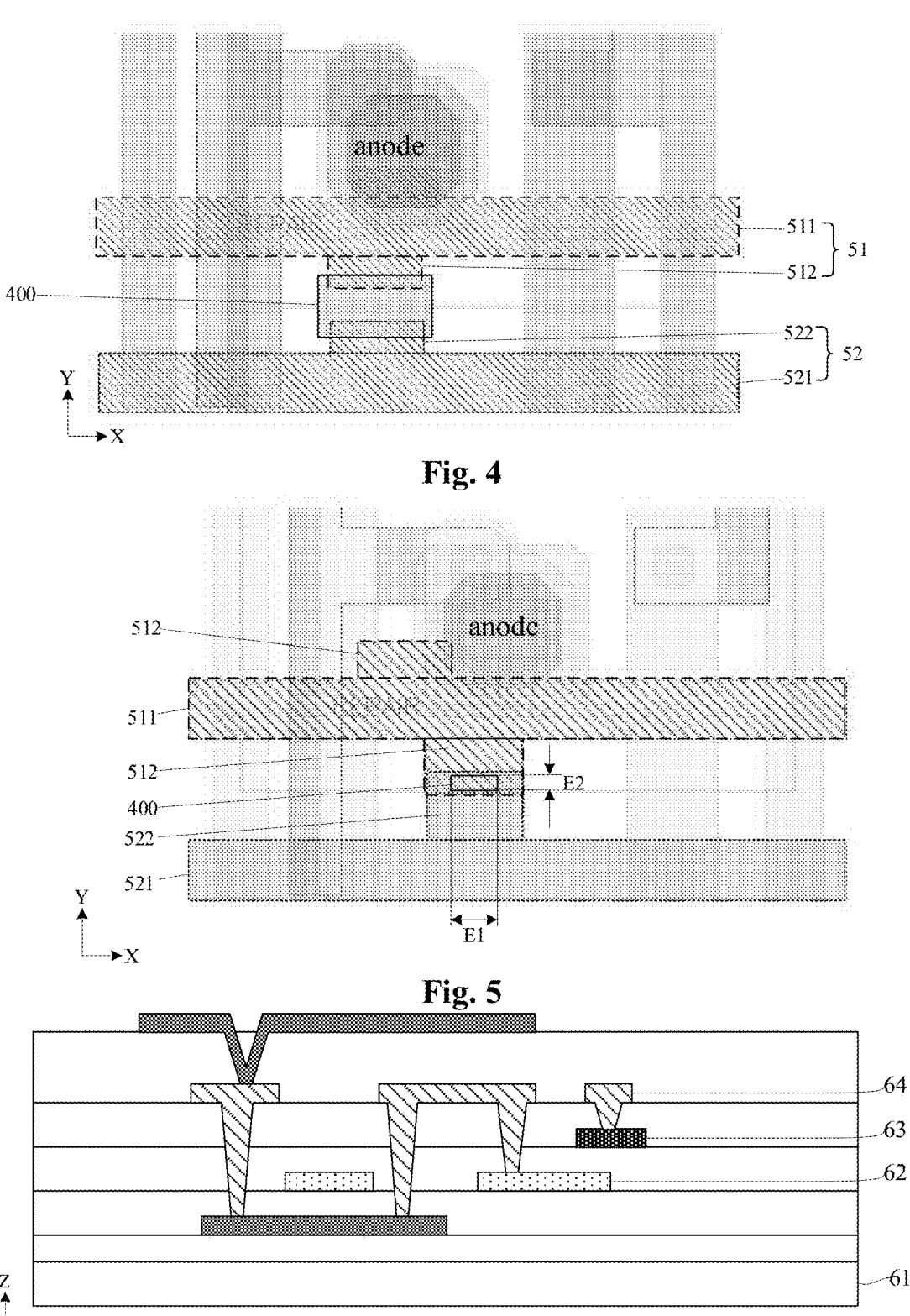
FIG. 4 illustrates a layout structural schematic diagram of a display panel consistent with the disclosed embodiments of the present disclosure.
FIG. 5 illustrates a layout structural schematic diagram of another display panel consistent with the disclosed embodiments of the present disclosure.
FIG. 6 illustrates a cross-sectional structural schematic diagram of a display panel consistent with the disclosed embodiments of the present disclosure.

FIG. 4 is a schematic layout structural diagram of a display panel 1 provided in an embodiment of the present application, and FIG. 5 is a schematic layout structural diagram of a display panel 1 provided in an embodiment of the present application. As shown in FIG. 1 to FIG. 5, in one embodiment, each of the first repair lines 51 comprises a first main line 511 and at least one first branch 512 connected with the first main line 511. Each of the second repair line 52 comprises a second main line 521 and at least one second branch 522 connected with the second main line 521. The first repair lines 51 and the second repair lines 52 are convex structures, respectively, wherein the first branches 512 are protruding portions of the first repair lines 51 in the direction of columns of the pixel circuits 20, and the second branches 522 are protruding portions of the second repair line 52 in the direction of columns of the pixel circuits 20. The numbers of the first branches 512 and the second branches 522 are related to the number of pixel circuits 20 the repair of which is supported by the pixel repair circuit 10.

Exemplarily, the numbers of the first branches 512 and the second branches 522 are greater than or equal to the number of the pixel circuits 20 the repair of which is supported by the pixel repair circuit 10. For example, for the display panel 1 shown in FIG. 1, the structure shown in FIG. 4 is adopted, and each row of M pixel circuits 20 corresponds to one pixel repair circuit 10, that is, when one pixel repair circuit 10 supports the repair of a row of M pixel circuits 20, the first repair lines 51 each comprise a first main line 511 and M first branches 512, and the second repair lines 52 each comprise a second main line 521 and M second branches 522. For another example, for the structure shown in FIG. 1, the structure shown in FIG. 5 is adopted, and each row of M pixel circuits 20 corresponds to one pixel repair circuit 10, that is, when one pixel repair circuit 10 supports the repair of a row of M pixel circuits 20, the first repair lines 51 each comprise a first main line 511 and 2M first branches 512, and the second repair lines 52 each comprise a second main line 521 and 2M second branches 522. For another example, for the display panel 1 shown in FIG. 3, the structure described in FIG. 4 is adopted, and each half row of M pixel circuits 20 corresponds to one pixel repair circuit 10, that is, one pixel repair circuit 10 supports the repair of half a row of M/2 pixel circuits 20. The first repair lines 51 each comprise a first main line 511 and at least M/2 first branches 512, and the second repair lines 52 each comprise a second main line 521 and at least M/2 second branches 522.

The first branches 512 and the second branches 522 are arranged correspondingly in the second direction. The second direction intersects with the first direction. Exemplarily, the second direction is the column direction of the pixel circuit 20. At least one first branch 512 is arranged corresponding to the light-emitting device 30. The first repair lines 51 are arranged close to the anodes of the light-emitting devices 30. Exemplarily, projections of the first repair lines 51 in the third direction at least partially overlap with projections of the anodes of the light-emitting devices 30 in the third direction. The third direction is perpendicular to the X-axis and the Y-axis directions, respectively. The first branches 512 are arranged close to one side of the second repair lines 52, and the second branches 522 are arranged close to one side of the first repair lines 51.

The first branch 512 and the second branch 522 corresponding to the target light-emitting device are connected via a connector 400 located at the target connecting point. It should be noted that the connecting point 40 is a virtual concept proposed in the embodiment of the present application, and the connector 400 is the actual physical structure of the connecting point 40 intended to electrically connect the first repair line 51 and the second repair line 52. The material of the connector 400 is a conductive material, comprising but not limited to metal conductive materials such as copper, aluminum, etc., which are not limited here. In use, when there is an abnormal pixel circuit 20 in the display panel 1, a connector 400 can be formed at a target connecting point position, the first repair line 51 and the second repair line 52 are connected via the connector 400, so that the anode of the light-emitting device 30 corresponding to the abnormal pixel circuit 20 is connected with the pixel repair circuit 10 via the first repair line 51 and the second repair line 52, so that the light-emitting device 30 is driven to emit light by the pixel repair circuit 10, and the pixel circuit 20 is repaired. It can also ensure the load balancing between the pixel repair circuits 10 and each pixel circuit 20, thereby improving the display effect.

FIG. 6 is a schematic cross-sectional structural diagram of a display panel 1 provided in an embodiment of the present application. As shown in FIGS. 1 to 6, in one embodiment, the first repair lines 51 and the second repair lines 52 are provided in a same layer. Thus, the first repair lines 51 and the second repair lines 52 can be provided in a same film layer, making full use of the plane space of the display panel 1, without the need to provide an additional film layer, and reducing costs.

Still referring to FIGS. 1 to 4, in one embodiment, when the first repair lines 51 and the second repair lines 52 are arranged in a same layer, the connectors 400 may comprise conductive layers, first conductive plugs, and second conductive plugs. The conductive layers and the first repair lines 51 are arranged in different layers, the conductive layers are connected with the first repair lines 51 via the first conductive plugs and connected with the second repair lines 52 via the second conductive plugs. Exemplarily, projections of the conductive layers in the third direction at least partially overlap with projections of the corresponding first branches 512 in the third direction, and projections of the conductive layers in the third direction at least partially overlap with projections of the corresponding second branches 522 in the third direction. In use, conductive layers may be pre-arranged at positions each corresponding to the connecting points 40. When an abnormality occurs in a pixel circuit 20, a first conductive plug and a second conductive plug are prepared at a target connecting point position of the abnormal pixel circuit 20 to form a connector 400, thereby connecting the first repair line 51 and the second repair line 52 at the target connecting point position via the connector 400, and then the anode of the light-emitting device 30 corresponding to the abnormal pixel circuit 20 is connected with the pixel repair circuit 10, so as to repair the pixel circuit 20 by the pixel repair circuit 10. The embodiments of the present application do not limit the method for preparing the conductive plug, for example, laser sintering or other methods may be used.

Referring to FIGS. 1 to 4 and 6, in one embodiment, the display panel 1 comprises a base plate 61 and a first metal layer 62, a second metal layer 63 and a third metal layer 64 that are sequentially away from the base plate 61. Exemplarily, the first metal layer 62 can be an M1 layer, the second metal layer 63 can be an MC layer, and the third metal layer 64 can be an M2 layer. Among them, the first repair lines 51 and the second repair lines 52 are respectively located in the second metal layer 63, and the conductive layers and the anodes of the light-emitting devices 30 are respectively located in the third metal layer 64. That is, the second metal layer 63 can be reused, and the first repair lines 51 and the second repair lines 52 are respectively arranged in the second metal layer 63, without the need to add an additional film layer, thereby reducing the cost. Based on this, exemplarily, at least one signal line can be arranged in the third metal layer 64, that is, the first repair lines 51 and the second repair lines 52 each are arranged in different layers with respect to the signal line, so as to avoid interference between the first repair lines 51 and the second repair lines 52 and the signal line, respectively, and ensure the normal display of the display panel 1. The signal line is connected with the pixel circuit 20, and used to provide at least one of a data signal, a power signal and a control signal to the pixel circuit 20.

Figure 7:
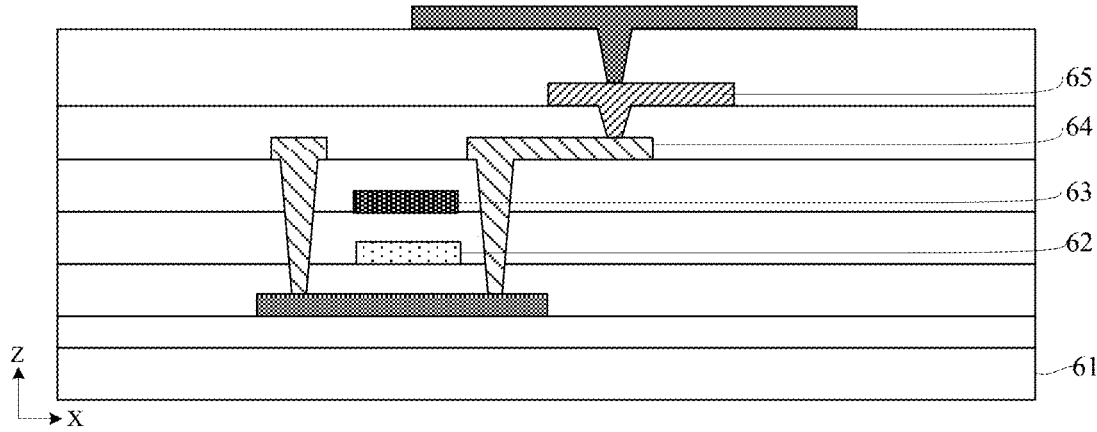
FIG. 7 illustrates a cross-sectional structural schematic diagram of another display panel consistent with the disclosed embodiments of the present disclosure.

FIG. 7 is a schematic cross-sectional structural diagram of a display panel 1 provided in an embodiment of the present application. As shown is FIGS. 1 to 4 and 7, in one embodiment, the display panel 1 comprises a base plate 61 and a first metal layer 62, a second metal layer 63, a third metal layer 64 and a fourth metal layer 65 that are sequentially away from the base plate 61. Exemplarily, the first metal layer 62 may be an M1 layer, the second metal layer 63 may be an MC layer, the third metal layer 64 may be an M2 layer, and the fourth metal layer 65 may be an M3 layer.

Among them, the first repair lines 51, the second repair lines 52 and the anodes of the light-emitting devices 30 are respectively located in the third metal layer 64, and the conductive layers are located in the third metal layer 64. That is, the third metal layer 64 can be reused, and the first repair lines 51 and the second repair lines 52 are set in the third metal layer 64, without the need to add an additional film layer, thereby reducing the cost. Based on this, exemplarily, at least one signal line can be set in the third metal layer 64, and the signal line can be set in the fourth metal layer 65, that is, the first repair lines 51 and the second repair lines 52 each are set in different layers with respect to the signal line, so as to avoid interference between the first repair lines 51 and the second repair lines 52 and the signal line, thereby ensuring the normal display of the display panel 1. In addition, since the resistance of the third metal layer 64 is smaller than that of the second metal layer 63, in the display panel 1 comprising the fourth metal layer 65, the first repair lines 51 and the second repair lines 52 are respectively set in the third metal layer 64, so as to reduce the line load between the pixel repair circuits 10 and the light-emitting devices 30, and further improve the display effect.

Referring to FIG. 7, in one embodiment, the first repair lines 51 and the second repair lines 52 are arranged in different layers. This can reduce the interference between first repair lines 51 and the second repair lines 52, and can fully utilize the vertical space of the display panel 1, save the plane space of the display panel 1, and reduce the area occupied by the repair lines on the display panel 1.

Referring to FIGS. 1 to 3 and 5, in one embodiment, when the first repair lines 51 and the second repair lines 52 are arranged in different layers, the connectors 400 may comprise third conductive plugs connected with the first repair lines 51 and the second repair lines 52 respectively. Since the first repair lines 51 and the second repair lines 52 are arranged in different layers, projections of the first repair lines 51 in the third direction may at least partially overlap with projections of the second repair lines 52 in the third direction. Based on this, the first repair lines 51 and the second repair lines 52 may be connected respectively via the third conductive plugs. In use, when an abnormality occurs in a pixel circuit 20, a third conductive plug may be formed at the position of the connecting point 40 corresponding to the abnormal pixel circuit 20, and the first repair line 51 and the second repair line 52 may be electrically connected via the third conductive plug, so that the pixel repair circuit 10 is connected with the anode of the light-emitting device 30, thereby repairing the pixel circuit 20 by the pixel repair circuit 10.

Referring to FIGS. 1 to 3, 5 and 7, in one embodiment, the display panel 1 comprises a base plate 61 and a first metal layer 62, a second metal layer 63, a third metal layer 64 and a fourth metal layer 65 that are sequentially away from the base plate 61. Among them, the first repair lines 51 are located in the second metal layer 63, the second repair lines 52 and the anodes of the light-emitting devices 30 are located in the third metal layer M3. Since the resistance of the third metal layer 64 is smaller than that of the second metal layer 63, in the display panel 1 comprising the fourth metal layer 65, the first repair lines 51 are arranged in the second metal layer 63 and the second repair lines 52 are arranged in the third metal layer 64, which can reduce the line load between the pixel repair circuits 10 and the light-emitting devices 30, and can further improve the display effect. Based on this, exemplarily, at least one signal line is located in the fourth metal layer, and connected with the pixel circuit 20, that is, the first repair lines 51 and the second repair lines 52 each are arranged in different layers with respect to the signal line to avoid interference between the first repair lines 51 and the second repair lines 52 and the signal line, respectively, and ensure the normal display of the display panel 1.

Referring to FIGS. 6 and 7, in one embodiment, orthographic projection of the connector 400 toward the base plate 61 do not overlap with orthographic projection of the first metal layer toward the base plate 61. In use, the second repair lines 52 can be connected with the pixel repair circuits 10. In the case there is an abnormal pixel circuit 20 in the display panel 1, it is necessary to prepare a connector 400 at the position of the connecting point 40 to connect the first repair line 51 and the second repair line 52, and it is necessary to connect the first repair line 51 and the anode of the light-emitting device 30 corresponding to the abnormal pixel circuit 20 at the connecting point 40. Generally, the connector 400 is prepared along a direction of the base plate 61 toward the first metal layer, that is, the positive direction of the Z axis, to connect the anode of the light-emitting device 30 corresponding to the abnormal pixel circuit 20 with the pixel repair circuit 10. The orthographic projection of the connector 400 toward the base plate 61 does not overlap with the orthographic projection of the first metal layer toward the base plate 61, indicating that in the direction of the base plate 61 toward the first metal layer, there is no metal layer shielding the connector 400, thereby reducing the impact on the first metal layer during the preparation of the connector 400, thereby ensuring the normal function of the display panel 1.

Referring to FIGS. 4 and 5, in one embodiment, shape of each of the conductive plugs (comprising the first conductive plugs, the second conductive plugs and the third conductive plugs) can be any suitable shape, for example, can be cylinder, cuboid, or other irregular shapes, and the present application does not impose too many restrictions.

Referring to FIG. 5, in one embodiment, size of each of the conductive plugs (comprising the first conductive plugs, the second conductive plugs and the third conductive plugs) in one direction is greater than or equal to the sum of the minimum metal line width and the minimum overlap width. The size of each conductive plug in another direction is greater than or equal to the minimum overlap width. Among them, one direction intersects with another direction, and these two directions are respectively perpendicular to the film layer distribution direction of the display panel 1, that is, the Z-axis direction. Among them, the minimum metal line width and the minimum overlap width are respectively related to the preparation process of the display panel. Specifically, the minimum metal line width is the width that ensures that the routing resistance is less than the maximum resistance required by the circuit. The minimum overlap width is the sum of the mask process alignment requirement width and the process loss width difference (CD Loss). The process loss width difference is the difference between the target width and the process implementation width.

For example, as shown in FIG. 5, the dimension E1 of the third conductive plug in the X-axis direction is greater than or equal to 3.9 µm, for example, it can be 3.9 µm, 4.0 µm, 4.5 µm, 6 µm, 10 µm, or any other value greater than or equal to 3.9 µm, which is not limited here. The dimension E2 of the third conductive plug in the Y-axis direction is greater than or equal to 1.6 µm, for example, it can be 1.6 µm, 2.0 µm, 2.5 µm, 4.0 µm, 5 µm, 8.5 µm, 10 µm, or any other value greater than or equal to 1.6 µm, which is not limited here. In this way, by designing the size of the conductive plug in the connector 400, it is ensured that the first conductive plug can effectively connect the first repair line 51 and the conductive layer, the second conductive plug can effectively connect the second repair line 52 and the conductive layer, and the third conductive plug can effectively connect the first repair line 51 and the second repair line 52, thereby ensuring the effectiveness and reliability of the circuit connection between the first repair line 51 and the second repair line 52, so that the pixel repair circuit 10 can effectively repair the abnormal pixel circuit 20 in the display panel 1.

Figure 8:
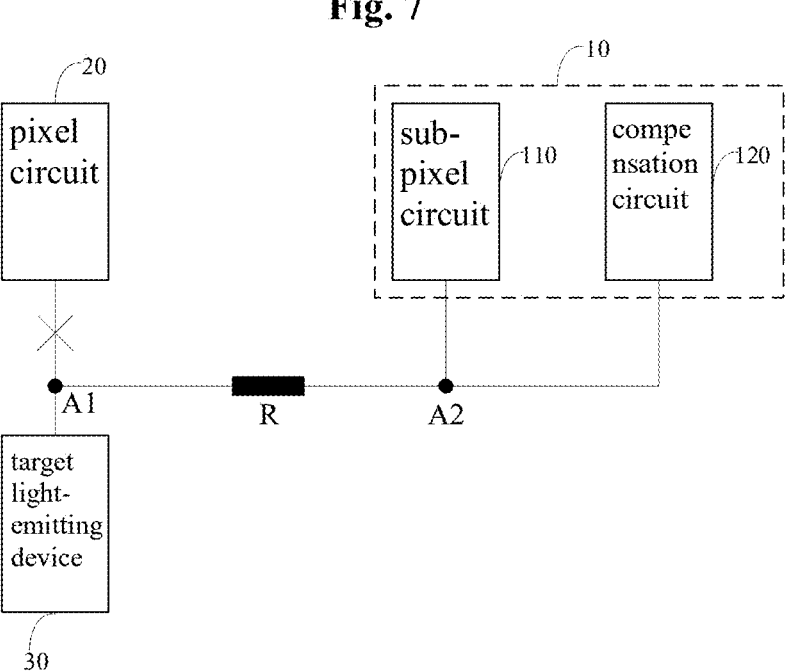
FIG. 8 illustrates a circuit structural schematic diagram of a display panel consistent with the disclosed embodiments of the present disclosure.
Figure 9:
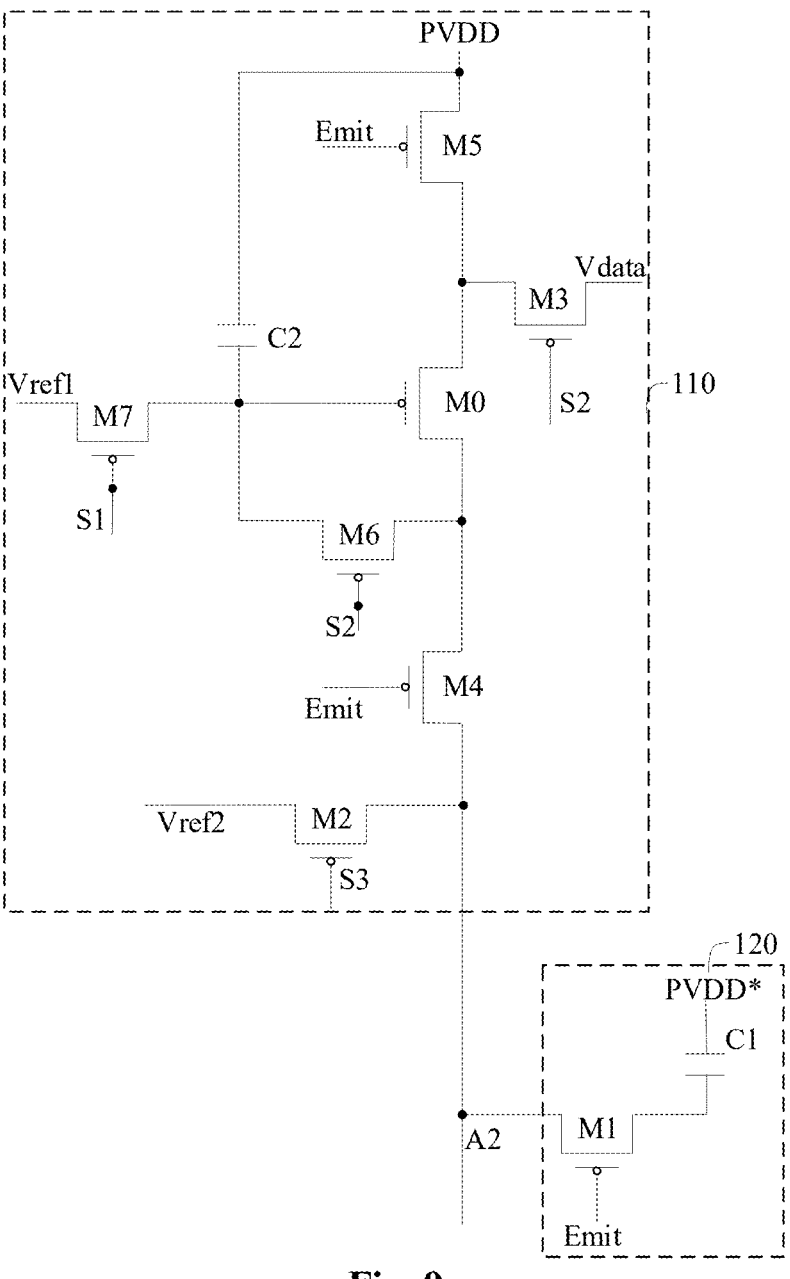
FIG. 9 illustrates a schematic structural diagram of a pixel repair circuit consistent with the disclosed embodiments of the present disclosure.
Figure 10:
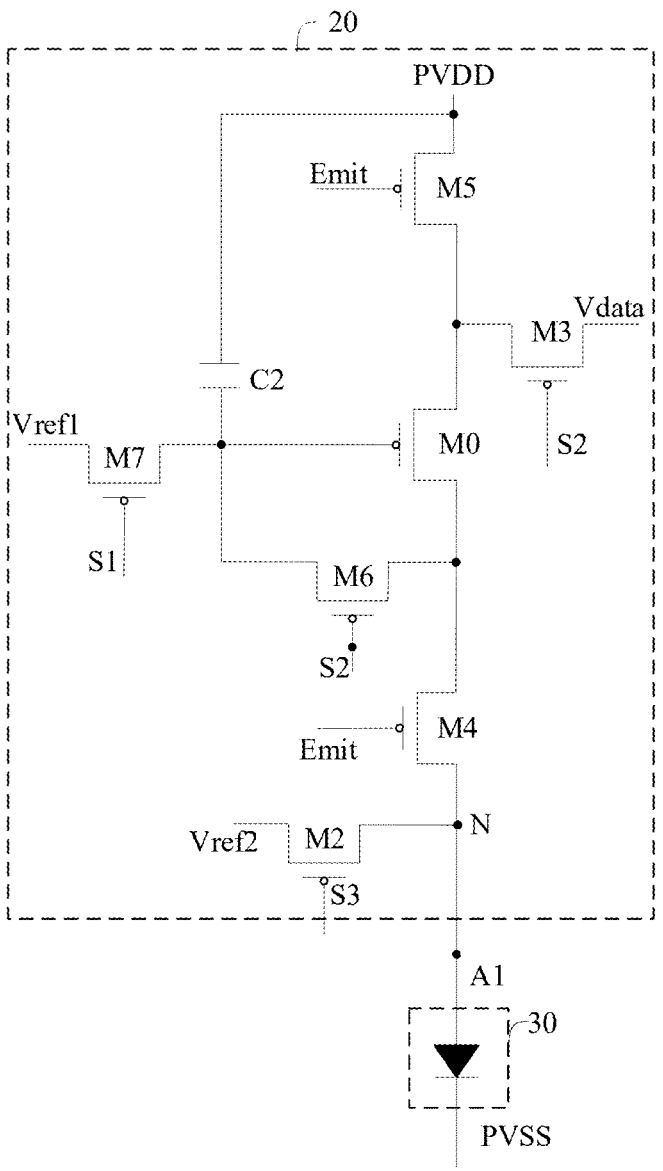
FIG. 10 illustrates a schematic structural diagram of a pixel circuit consistent with the disclosed embodiments of the present disclosure.
Figure 11:
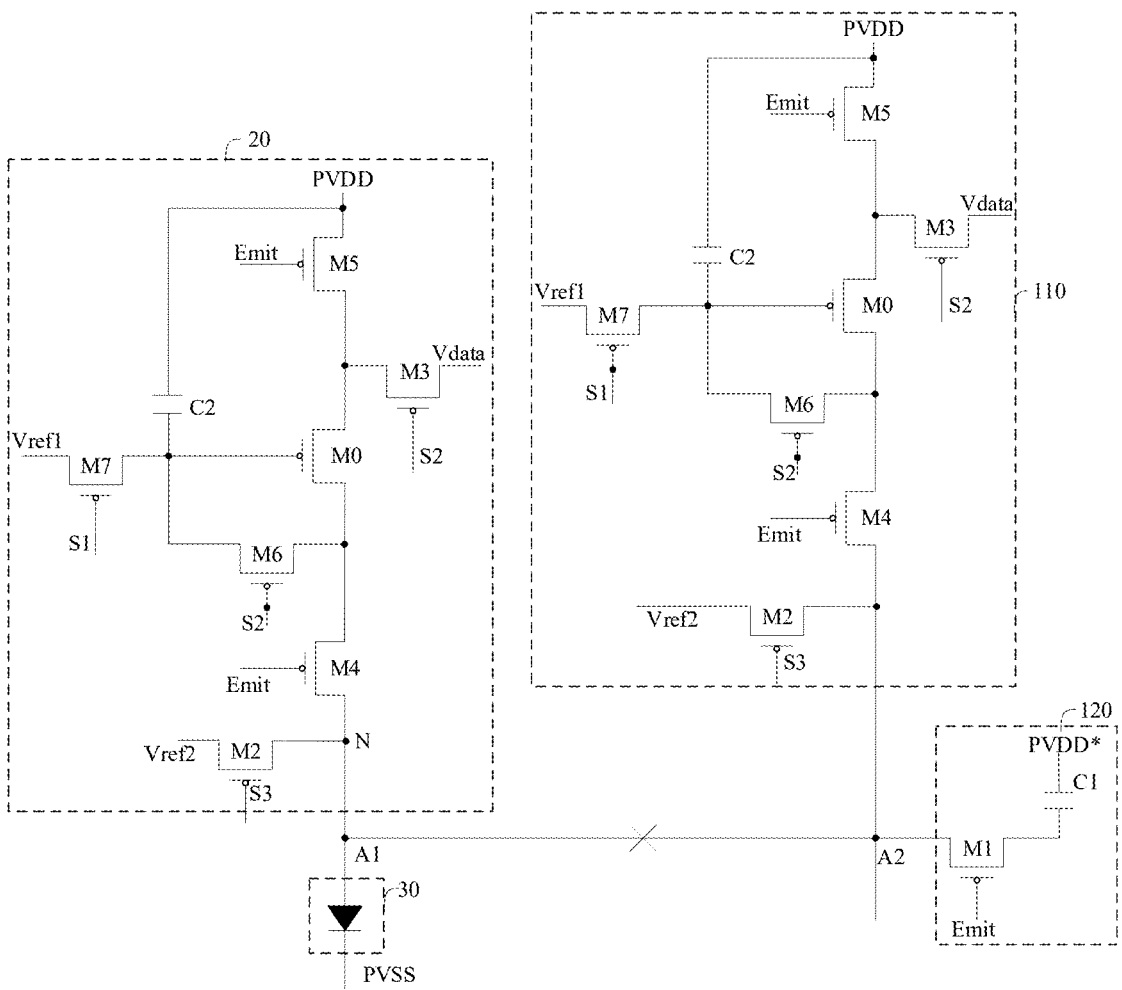
FIG. 11 illustrates a circuit structural schematic diagram of another display panel consistent with the disclosed embodiments of the present disclosure.
Figure 12:
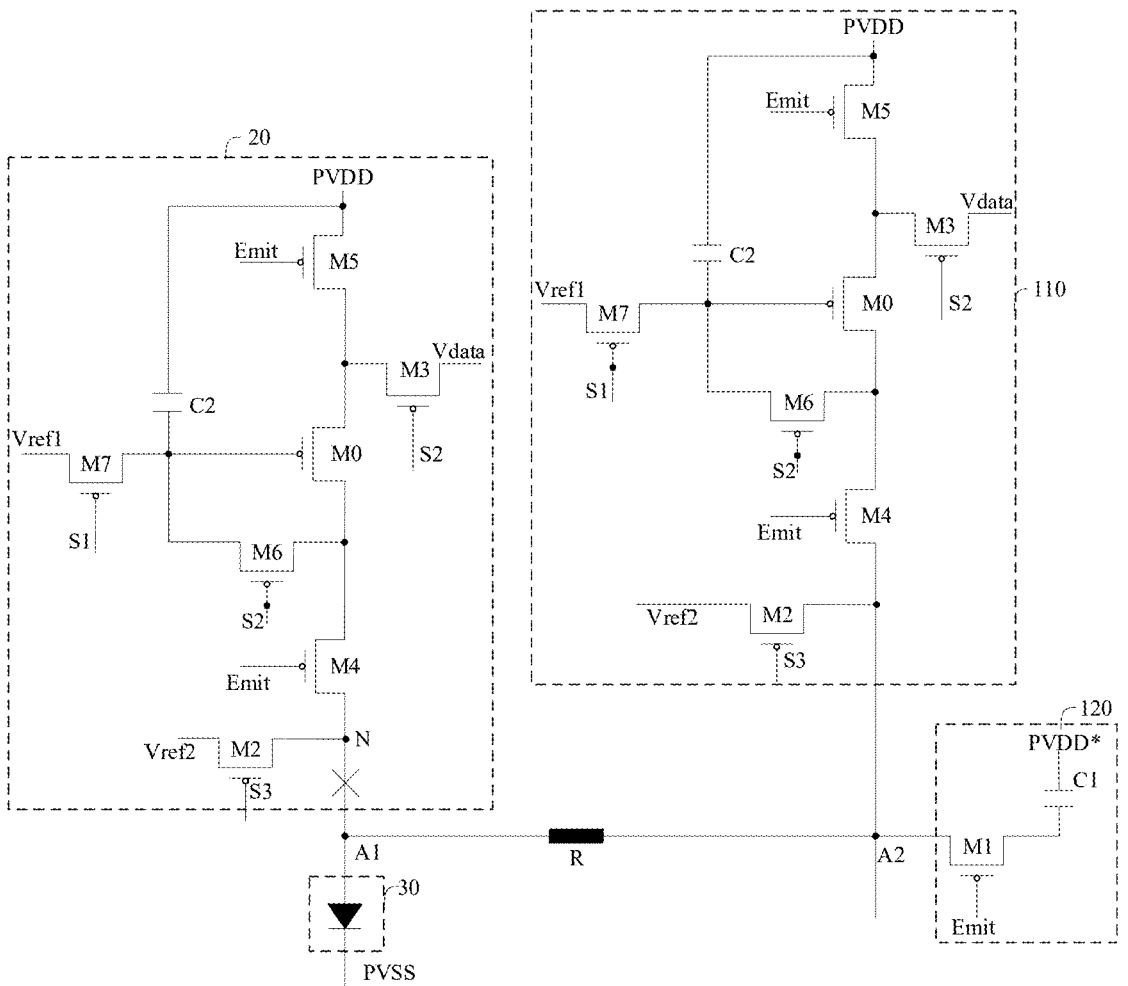
FIG. 12 illustrates a circuit structural schematic diagram of another display panel consistent with the disclosed embodiments of the present disclosure.

FIG. 8 is a schematic circuit structural diagram of a display panel 1 provided in an embodiment of the present application, FIG. 9 is a schematic structural diagram of a pixel repair circuit 10 provided in an embodiment of the present application, FIG. 10 is a schematic structural diagram of a pixel circuit 20 provided in an embodiment of the present application, FIG. 11 is a schematic circuit structural diagram of another display panel 1 provided in an embodiment of the present application, and FIG. 12 is a schematic circuit structural diagram of another display panel 1 provided in an embodiment of the present application. As shown in FIGS. 1 to 12, in one embodiment, the pixel repair circuits 10 each comprise a sub-pixel circuit 110 and a compensation circuit 120. Exemplarily, as shown in FIGS. 9 to 12, the sub-pixel circuit 110 of the pixel repair circuit 10 is the same as the pixel circuit 20 supported by the pixel repair circuit 10 for repair. An input end of the compensation circuit 120 is used to receive a compensation signal PVDD*, and an output end of the compensation circuit 120 is connected with an output end of a first light-emitting control transistor M4 of the sub-pixel circuit 110. In which, the compensation signal PVDD* is pre-set and can be set accordingly according to the load of the repair line between the pixel repair circuit 10 and the light-emitting device 30.

When the target pixel circuit is abnormal, the target pixel circuit is connected with the target light-emitting device. Specifically, the output end of the first light-emitting control transistor M4 in the target pixel circuit is connected with the anode of the target light-emitting device, the corresponding connection node is A1. The target pixel circuit drives the target light-emitting device to emit light.

In the case of an abnormality in the target pixel circuit, the target pixel repair circuit corresponding to the target pixel circuit is connected with the target light-emitting device. Specifically, the output end of the compensation circuit 120 in the target pixel repair circuit and the output end of the first light-emitting control transistor M4 of the sub-pixel circuit 110 are respectively connected with the anode of the target light-emitting device, and the corresponding connection node is A2. The sub-pixel circuit 110 and the compensation circuit 120 in the target pixel repair circuit together drive the target light-emitting device to emit light. The specific connection way of the target pixel repair circuit and the target light-emitting device can be found in the relevant description of the aforementioned embodiment, which will not be repeated here.

Here, the target pixel circuit is any one of the multiple pixel circuits 20 the repair of which is supported by the target pixel repair circuit. The compensation circuit 120 is intended to compensate for the effect of the repair line load between the target pixel repair circuit and the target light-emitting device on the light emission of the target light-emitting device. Exemplarily, the driving current of the target pixel circuit for driving the target light-emitting device is the same as the driving co-current of the sub-pixel circuit 110 and the compensation circuit 120 in the target pixel repair circuit for driving the target light-emitting device. Since the repair line load between the target pixel repair circuit and the target light-emitting device is equivalent to a resistor R, the repair line load will affect the brightness of the light-emitting device 30. Therefore, the pixel repair circuit 10 provided in the embodiments of the present application is provided with a compensation circuit 120 to compensate for the effect of the repair line load on the brightness of the target light-emitting device on the basis of providing a sub-pixel circuit 110 with the same structure as the target pixel circuit, so as to drive the target light-emitting device to emit light via the sub-pixel circuit 110 and the compensation circuit 120 together, so that the pixel repair circuit 10 replaces the target pixel circuit to drive the target light-emitting device to emit light at the same brightness as the target pixel circuit drives the target light-emitting device, which solves the problem of the decrease in light brightness due to the repair line load and further improves the display effect.

Referring to FIGS. 1 to 8, in one embodiment, the voltage of the compensation signal PVDD* received by the compensation circuit 120 is positively correlated with the load of the repair line. The load of the repair line is positively correlated with the length of the repair line. The length of the repair line is the sum of the distance between the target pixel circuit and the position of the target connecting point and the distance between the position of the target connecting point and the target pixel repair circuit, that is, the physical wiring length between the electrically connected target light-emitting device and the pixel repair circuit 10.

Based on the foregoing, in the display panel 1 provided in the embodiments of the present application, the lengths of the repair lines between the pixel repair circuits 10 each and the light-emitting devices 30 corresponding to different pixel circuits 20 are the same. Therefore, the repair line loads between the pixel repair circuits 10 and the light-emitting devices 30 corresponding to different pixel circuits 20 are the same, so the repair line loads each can be equivalent to a fixed resistor R, and will produce a voltage division effect. According to the driving current formula of the pixel circuit 20: $Id=k(Vsg-|Vth|)^2=k(PVDD-Vdata-|Vth|)^2$, it can be known that the repair line load will reduce the anode voltage of the target light-emitting device. Based on this, the pixel repair circuit 10 provided in the embodiment of the present application can set the voltage value of the compensation signal PVDD* received by the compensation circuit 120 according to the corresponding repair line load, and the voltage values of the compensation signals PVDD* of the pixel repair circuits 10 in the display panel 1 are the same, so as to compensate for the voltage drop effect of the repair line load on the light-emitting device 30 via the compensation signal PVDD*. Here, Id represents the driving current, PVDD represents the first power supply signal in a high level state in the pixel circuit 20, Vdata represents the data writing signal, and |Vth| represents the threshold voltage of the driving transistor M0 in the pixel circuit 20.

Specifically, the longer the repair line length is, the larger the repair line load is, the larger the equivalent resistance value R of the repair line load is, the greater the influence of the repair line load on the voltage drop of the light-emitting device 30 is, and accordingly, the greater the voltage value of the compensation signal PVDD* is; the shorter the repair line length is, the smaller the repair line load is, the smaller the equivalent resistance value R of the repair line load is, the smaller the influence of the repair line load on the voltage drop of the light-emitting device 30 is, and accordingly, the smaller the voltage value of the compensation signal PVDD* is. In the display panel 1 shown in FIG. 1 and FIG. 2, the length of the repair line is L+L0, and in the display panel 1 shown in FIG. 3, the length of the repair line is L/2+L0, then the compensation signal PVDD* in FIG. 1 and FIG. 2 can be set to the same voltage value, and the voltage value of the compensation signal PVDD* in FIG. 1 and FIG. 2 is greater than the voltage value of the compensation signal PVDD* in FIG. 3.

Referring to FIGS. 1 to 11, in one embodiment, the voltage value of the compensation signal PVDD* is the product of the maximum pixel current and the repair line load. The maximum pixel current is the current of the pixel circuit 20 at the maximum brightness. That is, PVDD*=Idmax*R, wherein PVDD* represents the voltage value of the compensation signal PVDD*, Idmax represents the maximum pixel current, and R represents the resistance value of the repair circuit load. In this way, the voltage of the compensation signal PVDD* can be used to completely compensate for the anode voltage drop of the light-emitting device 30 caused by the repair circuit load, thereby solving the influence of the repair line load on the light-emitting brightness and improving the display effect of the display panel 1.

Referring to FIG. 9, in one embodiment, the compensation circuit 120 comprises a compensation transistor M1 and a first capacitor C1. The gate of the compensation transistor M1 is used to receive a compensation control signal, the first electrode of the compensation transistor M1 is connected with the output end of the first light-emitting control transistor M4 in the sub-pixel circuit 110, the second electrode of the compensation transistor M1 is connected with the first electrode of the first capacitor C1, and the second electrode of the first capacitor C1 is used to receive a compensation signal PVDD*. The compensation transistor M1 is used to be turned on when the target light-emitting device is in the light-emitting stage under the action of the compensation control signal. The first capacitor C1 is used to maintain the anode potential of the target light-emitting device based on the received compensation signal PVDD* when the compensation transistor M1 is in the on state.

Referring to FIGS. 9 and 10, in one embodiment, the sub-pixel circuits 110 of the pixel repair circuits 10 and the pixel circuits 20 each comprise a driving transistor M0, a data writing transistor M3, a first light-emitting control transistor M4, a second light-emitting control transistor M5, a threshold compensation transistor M6, a first initialization transistor M7, a second initialization transistor M2 and a second capacitor C2. The gate of the driving transistor M0 is connected with the first electrode of the threshold compensation transistor M6, the second electrode of the first initialization transistor M7, and the first electrode of the second capacitor C2. The first electrode of the driving transistor M0 is connected with the second electrode of the second light-emitting control transistor M5 and the first electrode of the data writing transistor M3. The second electrode of the driving transistor M0 is connected with the second electrode of the threshold compensation transistor M6 and the first electrode of the first light-emitting control transistor M4. The first electrode of the second light-emitting control transistor M5 is connected with the second electrode of the second capacitor C2, and the first electrode of the second light-emitting control transistor M5 is used to receive the first power supply signal PVDD in a high level state. The gate of the second light-emitting control transistor M5 is used to receive the light-emitting control signal Emit. The first electrode of the first initialization transistor M7 is used to receive the first initialization signal Vref1, and the gate of the first initialization transistor M7 is used to receive the first scan signal S1. The second electrode of the data write transistor M3 is used to receive the data write signal Vdata, and the gate of the data write transistor M3 is used to receive the second scan signal S2. The gate of the threshold compensation transistor M6 is used to receive the second scan signal S2. The first electrode of the second initialization transistor M2 is used to receive the second initialization signal Vref2. The second electrode of the second initialization transistor M2 is connected with the second electrode of the second light-emitting control transistor M5, and the corresponding connection node is N. The cathode of the light-emitting device 30 is used to receive the second power supply signal PVSS in a low level state. The gate of the second initialization transistor M2 is used to receive the third scan signal S3. The gate of the first light-emitting control transistor M4 is used to receive the light-emitting control signal Emit.

Referring to FIGS. 9 to 11, when the pixel circuit 20 is normal, the second electrode of the first light-emitting control transistor M4 in the pixel circuit 20 is respectively connected with the second electrode of its second initialization transistor M2 and the anode of the light-emitting device 30. The second electrode of the first light-emitting control transistor M4 in the sub-pixel circuit 110 is respectively connected with the second electrode of its second initialization transistor M2 and the first electrode of the compensation transistor M1. In addition, the anode of the light-emitting device 30 is not connected with the second electrode of the first light-emitting control transistor M4 of the sub-pixel circuit 110 and the first electrode of the compensation transistor M1. Based on this, the pixel circuit 20 drives the light-emitting device 30 to emit light.

Referring to FIGS. 9, 10 and 12, in the case of a pixel circuit 20 is abnormal, the second electrode of the first light emission control transistor M4 of the pixel circuit 20 is connected with the second electrode of the second initialization transistor M2, and the second electrode of the first light emission control transistor M4 of the pixel circuit 20 is not connected with the anode of the light-emitting device 30. The second electrode of the first light emission control transistor M4 in the sub-pixel circuit 110 is respectively connected with the second electrode of its second initialization transistor M2, the first electrode of the compensation transistor M1, and the anode of the light-emitting device 30. Based on this, the sub-pixel circuit 110 and the compensation circuit 120 together drive the light-emitting device 30 to emit light.

Referring to FIGS. 9 to 12, for example, the compensation control signal received by the gate of the compensation transistor M1 can be the same signal as the light emission control signal Emit. It should be noted that FIGS. 9 to 12 are only exemplary. In actual applications, the sub-pixel circuit 110 and the pixel circuit 20 can also have other structures such as 8T1C, 9T2C, etc., which are not limited here.

Referring to FIGS. 8 to 12, the abnormal situation of the pixel circuit is analyzed from two aspects of resistance and capacitance. In one aspect, the influence of resistance is that, in the pixel circuit, PVDD=Vds (transistor source-drain voltage difference)+Ir (repair line loading)+Voled (light-emitting device cross-voltage); when Ir increases, Vds and Voled will decrease slightly, resulting in a slight change in Ids affecting the brightness. At high brightness, Vgs increases, and Ids will be more affected by the increase in Vds, making it easier to observe dark spots. In the other aspect, the influence of capacitance is that, since the repair lines (comprising the first repair line and the second repair line) may overlap with the signal line such as the data write signal line Vdata in the circuit, the data write signal line Vdata will drive the potential of the connection node N to decrease when charging, affecting the Ioled current, resulting in the light emission of the light-emitting device being affected. In this regard, the display panel provided in the embodiments of the present application can ensure that the lengths of the repair lines between the pixel repair circuits each and the light-emitting devices corresponding to the pixel circuits at different positions are the same. Therefore, not only can it ensure that the resistances equivalent to the repair line loads are equivalent, but it can also ensure that the coupling capacitances generated between the connection nodes N nodes and the signal line such as the data writing signal line Vdata are equivalent. Based on this, the repair line loads (RC Loading) are compensated by the pixel repair circuits, which can eliminate the influence of resistance and capacitance caused by inconsistent repair line lengths, thereby improving the display effect.

Referring to FIGS. 1 to 12, in one embodiment, the display panel 1 may be a display panel 1 designed with LTPS (Low Temperature Polycrystalline Silicon), on which basis the display panel 1 may comprise low temperature polycrystalline silicon transistors. In another embodiment, the display panel 1 may be a display panel 1 designed with LTPO (Low Temperature Polycrystalline Oxide), on which basis the display panel 1 may comprise low temperature polycrystalline oxide transistors.

Based on the same application concept, the embodiment of the present application further provides a display device 1000. FIG. 13 is a schematic structural diagram of a display device 1000 provided in the embodiment of the present application. As shown in FIG. 13, the display device 1000 comprises a display panel 1 in any of the above embodiments. Exemplarily, as shown in FIG. 13, the display device 1000 comprises a display panel 1. Therefore, the display device 1000 also has the beneficial effects of the display panel 1 in the above embodiments. The similarities can be understood by referring to the above explanation of the display panel 1, and will not be repeated below.

The display device 1000 provided in the embodiment of the present application can be the mobile phone shown in FIG. 13, or it can be any electronic product with a display function, comprising but not limited to: televisions, laptops, desktop displays, tablet computers, digital cameras, smart bracelets, smart glasses, car displays, industrial control equipment, medical display screens, touch interactive terminals, etc., and the embodiments of the present application does not make any special limitations on this.

Based on the same application concept, an embodiment of the present application further provides a pixel repair method involving the aforementioned display panel 1. The display panel 1 in one or more embodiments of the pixel repair method provided below can refer to the relevant description above and will not be repeated here.

FIG. 14 is a schematic flow chart of a pixel repair method provided in an embodiment of the present application. As shown in FIGS. 1 to 14, the pixel repair method may comprise the following steps S1401 to S1404.

S1401: confirming a target pixel circuit to be repaired;
S1402: determining a corresponding target connecting point and a target pixel repair circuit according to the target pixel circuit;
S1403: disconnecting the target pixel circuit and a corresponding target light-emitting device;
S1404: turning on paths corresponding to the target connecting point and the corresponding first repair line and second repair line, respectively, wherein the first repair line is connected with the anode of the target light-emitting device, and the second repair line is connected with the target pixel repair circuit.

Taking the display device 1000 comprising the display panel 1 shown in FIGS. 1 and 2 as an example, each pixel repair circuit 10 supports repairing a pixel circuit 20 at any position in the pixel circuits 20 of the corresponding row. Taking the display device 1000 comprising the display panel 1 shown in FIG. 3 as an example, each pixel repair circuit 10 supports repairing a pixel circuit 20 at any position in the pixel circuits 20 of the corresponding half row.

In use, if there is a target pixel circuit to be repaired, that is, an abnormal pixel circuit 20, in the display panel 1, a corresponding target connecting point and a target pixel repair circuit can be determined according to the target pixel circuit, and then the path between the target pixel circuit and the anode of the corresponding target light-emitting device is disconnected, and the first repair line 51 and the second repair line 52 are respectively connected at the target connecting point by laser sintering, so as to turn on the repair path between the target pixel repair circuit and the anode of the target light-emitting device, and then the target pixel repair circuit replaces the target repair circuit to drive the target light-emitting device to emit light. Since in the display panel 1 provided in the embodiments of the present application, the repair line lengths between the pixel repair circuits 10 and the light-emitting devices 30 corresponding to the pixel circuits 20 at different positions that they support repair are the same, therefore, the pixel repair method provided in the embodiment of the present application can improve the display effect of the display device 1000.

The technical features of the above-described embodiments may be arbitrarily combined. To make the description concise, not all possible combinations of the technical features in the above-described embodiments are described. However, as long as there is no contradiction in the combination of these technical features, they should be considered to be within the scope of this specification.

The above-mentioned embodiments only express several implementation ways of the present application, and the descriptions thereof are relatively specific and detailed, but they cannot be understood as limiting the scope of the invention patent. It should be pointed out that, for the skilled in the art, several variations and improvements can be made without departing from the concept of the present application, and these all belong to the protection scope of the present application. Therefore, the protection scope of the patent of the present application shall be subject to the attached claims.

What is claimed is:

1. A display panel, comprising:

pixel repair circuits;

pixel circuits connected with anodes of light-emitting devices, each row of the pixel circuits being provided with at least one of the pixel repair circuits, wherein the pixel repair circuits each are provided with a first repair line and a second repair line both extending along a first direction, the first repair lines being connected with the anodes of the light-emitting devices, the second repair lines being connected with the pixel repair circuits and the first repair lines, driving voltages output by the pixel repair circuits being transmitted to the anodes of the light-emitting devices via the first repair lines and the second repair lines;

a sum of a distance between a target light-emitting device corresponding to a target pixel circuit and a target connecting point and a distance between the target connecting point and a target pixel repair circuit meets a preset condition, the target connecting point being one of connecting points between the first repair lines and the second repair lines, and the target pixel circuit being any one of the pixel circuits repair of which is supported by the target pixel repair circuit;

the distance between the target connecting point and the target pixel circuit is negatively correlated with the distance between the target pixel circuit and the target pixel repair circuit; and the distance between the target connecting point and the target pixel circuit is positively correlated with the width of each row of the pixel circuits along the first direction.

2. The display panel of claim 1, wherein each row of the pixel circuits is provided with one of the pixel repair circuits that is located on a side of the corresponding row of the pixel circuits in the first direction, and the distance between the target connecting point and the target pixel circuit is $(L{-}X)/2$, where L represents the width of each row of the pixel circuits in the first direction, and X represents the distance between the target pixel circuit and the target pixel repair circuit.

3. The display panel of claim 1, wherein each row of the pixel circuits is provided with two of the pixel repair circuits that are located on two sides of the corresponding row of the pixel circuits in the first direction respectively, and the distance between the target connecting point and the target pixel circuit is $(L/2{-}X)/2$, where L represents the width of each row of the pixel circuits in the first direction, and X represents the distance between the target pixel circuit and the target pixel repair circuit.

4. The display panel of claim 1, wherein at least one of the pixel repair circuits comprises a sub-pixel circuit and a compensation circuit, an input end of the compensation circuit being configured to receive a compensation signal, and an output end of the compensation circuit being connected with an output end of a first light-emitting control transistor of the sub-pixel circuit;

an output end of the compensation circuit of the target pixel repair circuit is connected with the anode of the target light-emitting device;

when the target pixel circuit is abnormal, the sub-pixel circuit and the compensation circuit together drive the target light-emitting device to emit light; when the target pixel circuit is normal, the target pixel circuit drives the target light-emitting device to emit light.

5. The display panel of claim 4, wherein the voltage value of the compensation signal is positively correlated with a repair line load which is positively correlated with a repair line length which is a sum of a distance between the target pixel circuit and the target connecting point and a distance between the target connecting point and the target pixel repair circuit.

6. The display panel of claim 5, wherein the voltage value of the compensation signal is a product of a maximum pixel current and the repair line load, the maximum pixel current being a current of the pixel circuit at maximum brightness.

7. A display panel, comprising:

pixel repair circuits;

pixel circuits connected with anodes of light-emitting devices, each row of the pixel circuits being provided with at least one of the pixel repair circuits, wherein the pixel repair circuits each are provided with a first repair line and a second repair line both extending along a first direction, the first repair lines being connected with the anodes of the light-emitting devices, the second repair lines being connected with the pixel repair circuits and the first repair lines, driving voltages output by the pixel repair circuits being transmitted to the anodes of the light-emitting devices via the first repair lines and the second repair lines;

a sum of a distance between a target light-emitting device corresponding to a target pixel circuit and a target connecting point and a distance between the target connecting point and a target pixel repair circuit meets a preset condition, the target connecting point being one of connecting points between the first repair lines and the second repair lines, and the target pixel circuit being any one of the pixel circuits repair of which is supported by the target pixel repair circuit;

the first repair line comprises a first main line and at least one first branch connected with the first main line; and the second repair line comprises a second main line and at least one second branch connected with the second main line, the first branch being arranged corresponding to the second branch in a second direction, the light-emitting devices each being arranged corresponding to at least one of the first branches, the second direction intersecting with the first direction, the first branch and the second branch arranged corresponding to the target light-emitting device being connected via one of connectors that is located at the target connecting point.

8. The display panel of claim 7, wherein the first repair lines and the second repair lines are arranged in a same layer.

9. The display panel of claim 8, wherein the connectors each comprise a conductive layer, a first conductive plug, and a second conductive plug, the conductive layers and the first repair line being arranged in different layers, the conductive layers being connected with the first repair line via the first conductive plug and connected with the second repair lines via the second conductive plugs.

10. The display panel of claim 9, wherein the display panel comprises a substrate and a first metal layer, a second metal layer and a third metal layer sequentially away from the base plate, the first repair lines and the second repair lines being located in the second metal layer, and the conductive layers and the anodes of the light-emitting devices being located in the third metal layer; or the display panel comprises a substrate and a first metal layer, a second metal layer, a third metal layer and a fourth metal layer sequentially away from the base plate, the first repair lines, the second repair lines and the anodes of the light-emitting devices being located in the third metal layer, and the conductive layers being located in the second metal layer.

11. The display panel of claim 10, wherein orthographic projections of the connectors toward the substrate do not overlap with an orthographic projection of the first metal layer toward the base plate.

12. The display panel of claim 9, wherein a size of each of the conductive plugs in one direction is greater than or equal to a sum of a minimum metal line width and a minimum overlap width, and a size of each of the conductive plugs in the other direction is greater than or equal to the minimum overlap width, the one direction intersecting with the other direction.

13. The display panel of claim 7, wherein the first repair lines and the second repair lines are arranged in different layers.

14. The display panel of claim 13, wherein the connectors comprise third conductive plugs each connected with the first repair lines and the second repair lines.

15. The display panel of claim 14, wherein the display panel comprises a substrate and a first metal layer, a second metal layer, a third metal layer and a fourth metal layer sequentially away from the base plate, the first repair lines being located in the second metal layer, and the second repair lines and the anodes of the light-emitting devices being located in the third metal layer.

16. The display panel of claim 15, wherein at least one signal line is located in the fourth metal layer and connected with the pixel circuits, the at least one signal line being configured to provide at least one of a data signal, a power signal or a control signal to the pixel circuits.

17. The display panel of claim 13, wherein a size of each of the conductive plugs in one direction is greater than or equal to a sum of a minimum metal line width and a minimum overlap width, and a size of each of the conductive plugs in the other direction is greater than or equal to the minimum overlap width, the one direction intersecting with the other direction.

18. A display device, comprising the display panel according to claim 1.

19. A pixel repair method, applied to a display panel comprising:

pixel repair circuits;

pixel circuits connected with anodes of light-emitting devices, each row of the pixel circuits being provided with at least one of the pixel repair circuits, wherein the pixel repair circuits each are provided with a first repair line and a second repair line both extending along a first direction, the first repair lines being connected with the anodes of the light-emitting devices, the second repair lines being connected with the pixel repair circuits and the first repair lines, driving voltages output by the pixel repair circuits being transmitted to the anodes of the light-emitting devices via the first repair lines and the second repair lines;

a sum of a distance between a target light-emitting device corresponding to a target pixel circuit and a target connecting point and a distance between the target connecting point and a target pixel repair circuit meets a preset condition, the target connecting point being one of connecting points between the first repair lines and the second repair lines, and the target pixel circuit being any one of the pixel circuits repair of which is supported by the target pixel repair circuit, the distance between the target connecting point and the target pixel circuit is negatively correlated with the distance between the target pixel circuit and the target pixel repair circuit; and the distance between the target connecting point and the target pixel circuit is positively correlated with the width of each row of the pixel circuits along the first direction, the pixel repair method comprising:

determining a target pixel circuit to be repaired;

determining a corresponding target connecting point and a corresponding target pixel repair circuit according to the target pixel circuit;

disconnecting the target pixel circuit from a corresponding target light-emitting device;

connecting the target connecting point with a corresponding first repair line and a corresponding second repair line respectively, wherein the first repair line is connected with the anode of the target light-emitting device, and the second repair line is connected with the target pixel repair circuit.

\* \* \* \* \*